(12) United States Patent
Kimchi et al.

(10) Patent No.: US 9,767,230 B2
(45) Date of Patent: Sep. 19, 2017

(54) METHOD FOR AUTOMATIC BEHAVIORAL PHENOTYPING

(75) Inventors: Tali Kimchi, Tel-Aviv (IL); Aharon Weissbrod, Rehovot (IL); Genadiy Vasserman, Rehovot (IL)

(73) Assignee: Yeda Research and Development Co. Ltd., Rehovot (IL)

(*) Notice: Subject to any disclaimer, the term of this patent is extended or adjusted under 35 U.S.C. 154(b) by 0 days.

(21) Appl. No.: 14/236,662

(22) PCT Filed: Aug. 3, 2012

(86) PCT No.: PCT/IB2012/053985
§ 371 (c)(1),
(2), (4) Date: Feb. 3, 2014

(87) PCT Pub. No.: WO2013/018070
PCT Pub. Date: Feb. 7, 2013

(65) Prior Publication Data
US 2014/0167958 A1 Jun. 19, 2014

Related U.S. Application Data

(60) Provisional application No. 61/514,705, filed on Aug. 3, 2011, provisional application No. 61/531,107, filed on Sep. 6, 2011.

(51) Int. Cl.
*G08B 1/08* (2006.01)
*G06F 17/50* (2006.01)
(Continued)

(52) U.S. Cl.
CPC .......... *G06F 17/5009* (2013.01); *A01K 1/031* (2013.01); *A01K 29/005* (2013.01);
(Continued)

(58) Field of Classification Search
CPC ... G06F 17/5009; A01K 1/031; A01K 29/005; G01S 3/14; G01S 3/7864; G06K 9/6282
(Continued)

(56) References Cited

U.S. PATENT DOCUMENTS 6,678,413 B1   1/2004 Liang et al.
7,269,516 B2 * 9/2007 Brunner et al. ............. 702/19
(Continued)

FOREIGN PATENT DOCUMENTS

EP         2246799        11/2010
WO    WO 2013/018068      2/2013
WO    WO 2013/018070      2/2013

OTHER PUBLICATIONS

International Preliminary Report on Patentability Dated Feb. 13, 2014 From the International Bureau of WIPO Re. Application No. PCT/IB2012/053985.
(Continued)

*Primary Examiner* — Kerri McNally

(57) ABSTRACT

A method of identifying and classifying social complex behaviors among a group of model organisms, comprising implanting at least one RFID transponder in each model organism in said group of model organisms; enclosing said group of model organisms in a monitored space divided into RFID monitored segments; RFID tracking a position of each model organism by reading said at least one RFID transponder in each model organism over a period of time; capturing a sequence of images of each model organism over said period of time; and calculating at least one spatiotemporal model of each model organism based on time synchronization of said RFID tracked position of said model organism with said sequence of images.

47 Claims, 13 Drawing Sheets
(4 of 13 Drawing Sheet(s) Filed in Color)

(51) Int. Cl.
| | |
|---|---|
| A01K 1/03 | (2006.01) |
| A01K 29/00 | (2006.01) |
| G06K 9/62 | (2006.01) |
| G01S 3/14 | (2006.01) |
| G01S 3/786 | (2006.01) |

(52) U.S. Cl.
CPC .............. *G01S 3/14* (2013.01); *G01S 3/7864* (2013.01); *G06K 9/6282* (2013.01)

(58) Field of Classification Search
USPC ................................................... 340/539.13
See application file for complete search history.

(56) References Cited

U.S. PATENT DOCUMENTS

| 7,580,798 B2 | 8/2009 | Brunner et al. | |
|---|---|---|---|
| 2003/0004652 A1 | 1/2003 | Brunner et al. | |
| 2008/0152192 A1* | 6/2008 | Zhu .................... | G06K 9/00771 382/103 |
| 2009/0002155 A1* | 1/2009 | Ma et al. ................. | 340/539.25 |
| 2010/0106743 A1 | 4/2010 | Brunner et al. | |
| 2010/0111359 A1 | 5/2010 | Bai et al. | |
| 2014/0207433 A1 | 7/2014 | Chen et al. | |
| 2015/0146939 A1 | 5/2015 | Datta et al. | |
| 2016/0213317 A1 | 7/2016 | Richardson et al. | |

OTHER PUBLICATIONS

International Preliminary Report on Patentability Dated Feb. 13, 2014 From the International Bureau of WIPO Re. Application No. PCT/IB2012/053982.
International Search Report and the Written Opinion Dated Dec. 4, 2012 From the International Searching Authority Re. Application No. PCT/IB2012/053982.
International Search Report and the Written Opinion Dated Dec. 11, 2012 From the International Searching Authority Re. Application No. PCT/IB2012/053985.
Benson et al. "Gender-Specific Transfusion Affects Tumor-Associated Neutrophil: Macrophage Ratios in Murine Pancreatic Adenocarcinoma", Journal of Gastrointest Surgery, 14(10): 1560-1565, Oct. 2010.
Brown et al. "EMPReSS: Standardized Phenotype Screens for Functional Annotation of the Mouse Genome" Nature Genetics, 37(11): 1155, Nov. 2005.
Carter et al. "Characterization of Progressive Motor Deficits in Mice Transgenic for the Human Huntington's Disease Mutation", The Journal of Neuroscience, 19(8): 3248-3257, Apr. 15, 1999.
Carter et al. "Motor Coordination and Balance in Rodents", Current Protocols in Neuroscience, Chap.8: Unit 8.12, Aug. 2001. Abstract.
Clement et al. "Genetic Basis of Anxiety-Like Behaviour: A Critical Review", Brain Research Bulletin, 57(1): 57-71, Jan. 2002.
Codita "Automated Behavioral Phenotyping of Inbred Mouse Strains and Mouse Models of Alzheimer Disease", Thesis, From the Deaprtment of Neurobiology, Care Sciences and Society, Karolinska Institutet, Stockholm, Sweden, p. 1-75, 2011.
Crawley "Behavioral Phenotyping of Rodents", Comparative Medicine, 53(2): 140-146, Apr. 2003.
Crawley "Behavioral Phenotyping of Transgenic and Knockout Mice: Experimental Design and Evaluation of General Health, Sensory Functions, Motor Abilities, and Specific Behavioral Tests", Brain Research, 835(1): 18-26, Jul. 17, 1999.
Crawley "Behavioral Phenotyping Strategies for Mutant Mice", Neuron, 57(6): 809-818, Mar. 27, 2008.
Crawley "Exploratory Behavior Models of Anxiety in Mice", Neuroscience & Biobehavioral Reviews, 9: 37-44, 1985.
Crawley "Mouse Behavioral Assays Relevant to the Symptoms of Autism", Brain Pathology, 17(4): 448-459, Oct. 2007.
File "Factors Controlling Measures of Anxiety and Responses to Novelty in the Mouse", Behavioural Brain Research, 125(1-2): 151-157, Nov. 8, 2001.
Fridman et al. "Towards a Cognitive Model of Crowd Behavior Based on Social Comparison Theory", Proceedings of the 22nd National Conference on Artificial Intelligence, AAAI'07, Vancouver, British Columbia, Canada, Jul. 22-26, 2007, 1: 1-7, Dec. 31, 2007.
Holmes et al. "Abnormal Anxiety-Related Behavior in Serotonin Transporter Null Mutant Mice: The Influence of Genetic Background", Genes, Brain and Behavior, 2(6): 365-380, Dec. 2003.
Jhuang et al. "Automated Home-Cage Behavioural Phenotyping of Mice", Nature Communications, 1(68): p. 1-9, Sep. 7, 2010.
Konkle et al. "Evaluation of the Effects of Chronic Mild Stressors on Hedonic and Physiological Responses: Sex and Strain Compared", Brain Research, 992(2): 227-238, Dec. 5, 2003.
Kritzler et al. "A GIS Framework for Spatio-Temporal Analysis and Visualization of Laboratory Mice Tracking Data", Draft, Transactions in GIS, 11(5): 765-782, 2007.
Kritzler et al. "A GIS Framework for Spatio-Temporal Analysis and Visualization of Laboratory Mice Tracking Data", Transactions in GIS, 11(5): 765-782, Oct. 22, 2007.
Kritzler et al. "An RFID-Based Tracking System for Laboratory Mice in a Semi Natural Environment", Pervasive 2006 Workshop Proceedings in PTA 2006 Workshop, Pervasive—Pervasive Technology Applied Real-World Experiences With RFID and Sensor Networks, 6 P., 2006.
Kritzler et al. "Analysing Movement and Behavioural Patterns of Laboratory Mice in a Semi Natural Environment Based on Data Collected Via RFID Technology", Behaviour Monitoring, BMI'07, CEUR Workshop Proceedings, Osnabrück, Germany, 296: 17-28, Nov. 14, 2007.
Kritzler et al. "Concept of a Framework for Moving Objects Based on Different Data Sources", Institute for Geoinformatics, University of Muenster, Germany, 3 P.
Lewejohann et al. "Behavioral Phenotyping of a Murine Model of Alzheiner's Disease in a Seminaturalistic Environment Using RFID Tracking", Behavior Research Methods, 41(3): 850-856, 2009.
Mandillo et al. "Reliability, Robustness, and Reproducibility in Mouse Behavioral Phenotyping: A Cross-Laboratory Study", Physiological Genomics, 34(3): 243-255, 2008.
Markou et al. "Removing Obstacles in Neuroscience Drug Discovery: The Future Path for Animal Models", Neuropsychopharmacology, 34: 74-89, Oct. 2009.
Menalled et al. "Systematic Behavioral Evaluation of the Huntington's Disease Transgenic and Knock-In Mouse Models", Neurobiology of Disease, 35(3): 319-336, Sep. 2009.
Moreau "Reliable Monitoring of Hedonic Deficits in the Chronic Mild Stress Model of Depression", Psychopharmacology, 134(4): 357-358, Dec. 1997.
Morgan et al. "EuroPhenome: A Repository for High-Throughput Mouse Phenotyping Data", Nucleic Acids Research, 38: D577-D585, 2010.
Morris "Episodic-Like Memory in Animals: Psychological Criteria, Neural Mechanisms and the Value of Episodic-Like Tasks to Investigate Animal Models of Neurodegenerative Disease", Philosophical Transactions of the Royal Society of London, Series B, Biological Sciences, 356(1413): 1453-1465, Sep. 29, 2001.
Moy et al. "Development of a Mouse Test for Repetitive, Restricted Behaviors: Relevance to Autism", Behavioural Brain Research, 188(1): 178-194, Mar. 17, 2008.
Ricceri et al. "Behavioral Phenotyping of Mouse Models of Neurodevelopmental Disorders: Relevant Social Behavior Patterns Across the Life Span", Behavioural Brain Research, 176(1): 40-52, Jan. 10, 2007.
Rogers et al. "Use of SHIRPA and Discriminant Analysis to Characterise Marked Differences in the Behavioural Phenotype of Six Inbred Mouse Strains", Behavioural Brain Research, 105(2): 207-217, Nov. 1999.
Schneidman et al. "Network Information and Connected Correlations", Physical Review Letters, 91(23): 238701-1-238701-4, Dec. 2, 2003.

(56) References Cited

OTHER PUBLICATIONS

Sedelis et al. "Behavioral Phenotyping of the MPTP Mouse Model of Parkinson's Disease", Behavioural Brain Research, 125(1-2): 109-122, Nov. 8, 2001.

Silverman et al. "Behavioural Phenotyping Assays for Mouse Models of Autism" Nature Reviews Neuroscience, 11: 490-502, Jul. 2010.

Steele et al. "The Power of Automated High-Resolution Behavior Analysis Revealed by Its Application to Mouse Models of Huntington's and Prion Diseases", PNAS, 104(6): 1983-1988, Feb. 6, 2007.

Unknown "A Human Pheromone?", The Lancet, 279-280, Feb. 6, 1971.

Van Der Staay et al. "Behavioural Phenotyping of Mouse Mutants", Behavioural Brain Research, 125(1-2): 3-12, Nov. 8, 2001.

Winter et al. "A Sorting System With Automated Gates Permits Individual Operant Experiments With Mice From a Social Home Cage", Journal of Neuroscience Methods, 196(2): 276-280, Mar. 30, 2011.

Supplementary European Search Report and the European Search Opinion Dated Nov. 9, 2015 From the European Patent Office Re. Application No. 12819400.8.

Supplementary European Search Report and the European Search Opinion Dated Nov. 9, 2015 From the European Patent Office Re. Application No. 12819653.2.

Young et al. "A Reverse-Translational Approach to Bipolar Disorder: Rodent and Human Studies in the Behavioral Pattern Monitor", Neuroscience and Behavioral Reviews, XP022213290, 31(6): 882-896, Aug. 24, 2007. p. 892, Para 2.

Official Action dated Oct. 6, 2016 From the US Patent and Trademark Office Re. U.S. Appl. No. 14/236,674.

Bode et al. "Social Networks and Models for Collective Motion in Animals", Behavioral Ecology and Sociobiology, 65(2): 117-130, Published Online Nov. 24, 2010.

Deacon "Housing, Husbandry and Handling of Rodents for Behavioral Experiments", Nature Pprotocols, 1(2): 936-946, 2006.

Lusseau et al. "Formalising the Multidimensional Nature of Social Networks", Retrieved from arXiv, 1101.3735 [physics.soc-ph], 17 Pages, Jan. 19, 2011.

Shemesh et al. "High-Order Social Interactions of Mice", eLIFE, 2: e00759, p. 1-19, 2013.

Communication Pursuant to Article 94(3) EPC dated Feb. 24, 2017 From the European Patent Office Re. Application No. 12819653.2. (8 Pages).

* cited by examiner

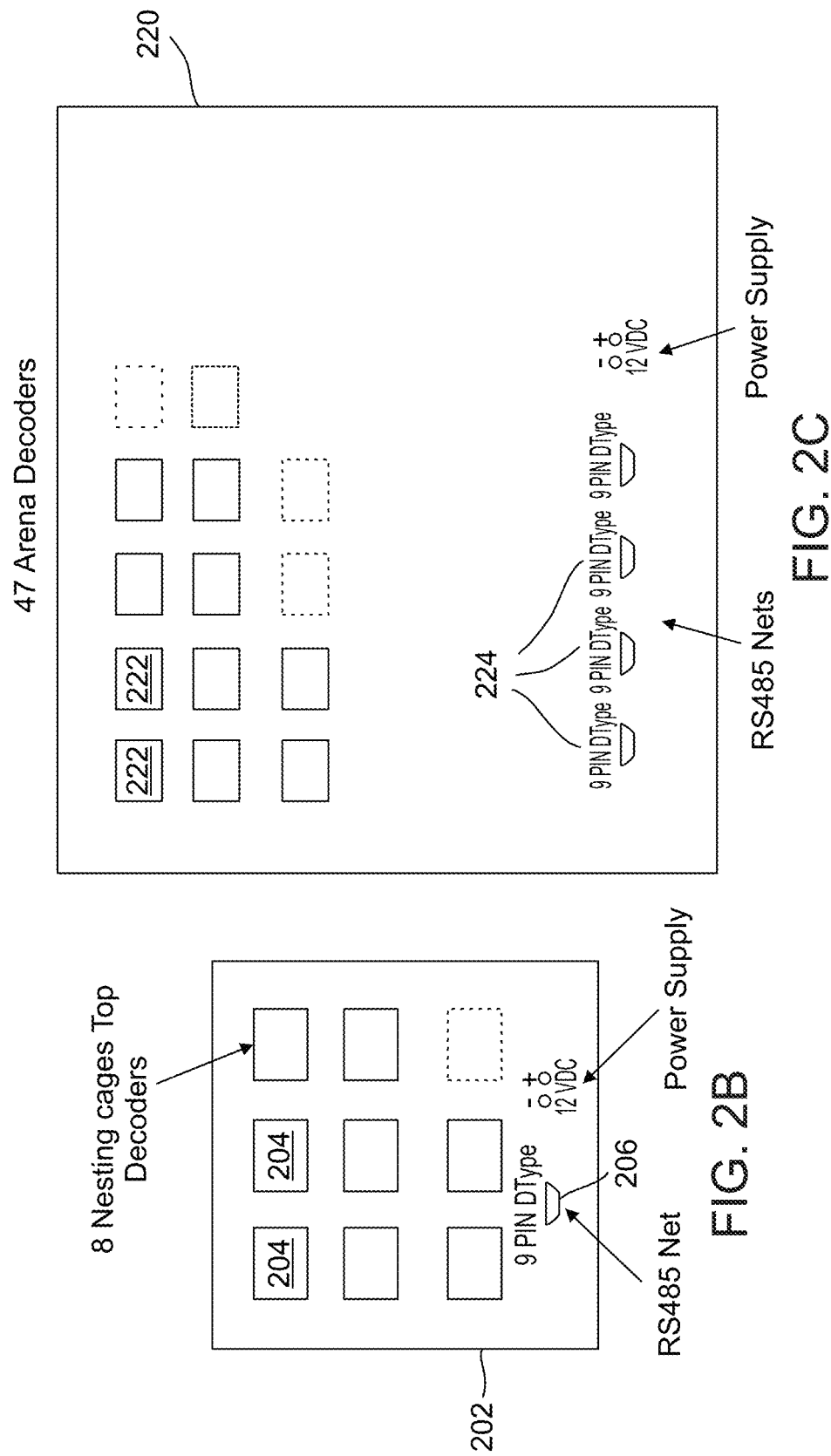

FIG. 14
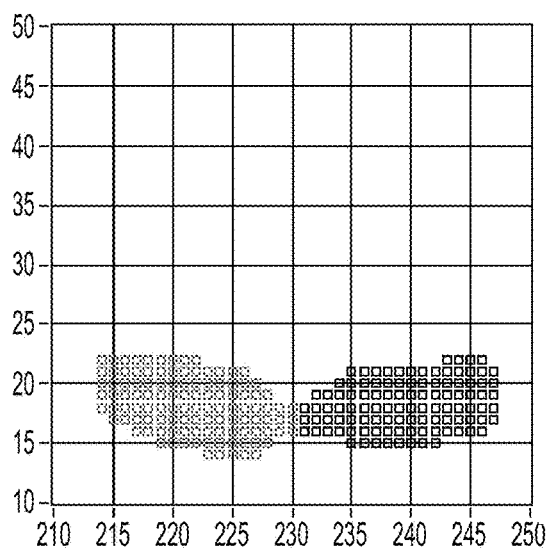  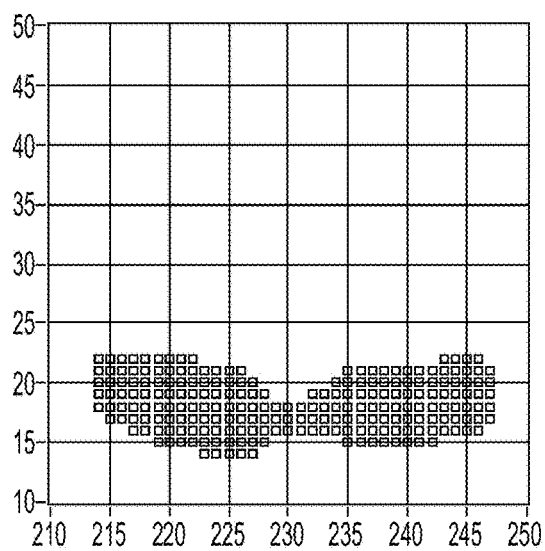
FIG. 15  FIG. 16
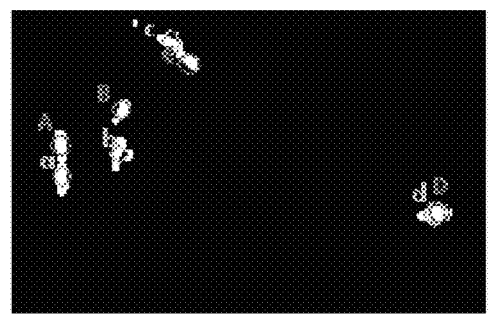
FIG. 17

METHOD FOR AUTOMATIC BEHAVIORAL PHENOTYPING

RELATED APPLICATIONS

This application is a National Phase of PCT Patent Application No. PCT/IB2012/053985 having International Filing date of Aug. 3, 2012, which claims the benefit of priority under 35 USC §119(e) of U.S. Provisional Patent Application No. 61/514,705 filed Aug. 3, 2011 and U.S. Provisional Patent Application No. 61/531,107 filed Sep. 6, 2011. The contents of the above applications are all incorporated by reference as if fully set forth herein in their entirety. PCT Patent Application No. PCT/IB2012/053985 is also related to PCT Patent Application No. PCT/IB2012/053982 having International Filing date of Aug. 3, 2012, titled SYSTEMS AND METHODS OF MONITORING SOCIAL INTERACTIONS IN A GROUP OF ORGANISMS OVER A PERIOD OF AT LEAST 24 HOURS IN A SEMI-NATURAL ENVIRONMENT, by Applicants Yeda Research and Development Co. Ltd., et al., the disclosure of which is incorporated herein by reference.

FIELD AND BACKGROUND OF THE INVENTION

The present invention, in some embodiments thereof, relates to behavioral phenotyping and, more particularly, but not exclusively, to a method and apparatus for automatically classifying behavioral phenotypes and/or reactions to treatments in model organisms, for example, from single to multiple socially interacting individuals.

Laboratory mice, rats, fish and many other organisms display many genetic and behavioral characteristics which resemble that of humans. This makes them suitable candidates for testing and for evaluating the effects of drugs and other treatments being developed for humans. In particular, mice and humans share many behavioral characteristics such as, for example, anxiety, aggression, circadian rhythm, and sexual behavior, among others. By observing changes in mouse behavior during testing, conclusions may be derived by researchers as to the effect the drugs/treatments may have on humans.

Use of mice for evaluating the effects of drugs/treatment has led researchers to generate thousands of mutant mouse strains. The researchers generally first identify the genes and mechanisms involved in various human heritable diseases to enable the assessment of potential therapeutic tools. With this information, the researchers generate mutant mouse strains phenotyping each strain and assigning a function to each mouse gene.

In order to behaviorally phenotype a mouse strain, a wide range of experimental set-ups and methodologies are currently required. For example, models of generalized anxiety disorders include approach-avoidance conflict behaviors, including the elevated plus maze, light-dark exploration, open field exploration [1-6]. Detection of memory deficits in Alzheimer's models include using learning and memory tests, including spatial navigation tasks such as the Morris water maze, Barnes maze, radial maze, and T-maze; emotional memory tasks such as contextual and cued fear conditioning; and aversive tasks such as active and passive avoidance [7-10]. Parkinson's and Huntington's disease models include use of sensitive motor tasks such as balance beam walking, walking and footprint pattern (e.g. cat walk system, Noldus) [8, 11-14]. Rodents' tasks sensitive to antidepressant drugs include forced swim, tail suspension, and stressor-induced anhedonia [2, 15-17].

There are few standard possibly automated behavioral paradigms that are routinely used to assay autism-like social behavioral symptoms in mouse models, albeit in very artificial settings, including a three chambered apparatus that is used to assay sociability and social memory, a phenotyper apparatus that scores the social interactions of a resident mouse with an intruding novel mouse, and auditory communication assays that quantify the level of ultrasonic vocalization of new born pups when being separated from their mother [22-24, 26, 27].

Some systems and methods for behaviorally phenotyping mouse strains or for assessing the effects of drugs/treatments on the mice include means for tracking their movements under diverse environments. In some cases, the tracking means may include use of radio frequency identification (RFID) technology with RFID transponders implanted in the mice. The art includes the following:

a) Kritzler et al., *An RFID-based Tracking System for Laboratory Mice in a Semi Natural Environment*, wwwdotciteseerxdotistdotpsudotedu/vie wdoc/.

b) Kritzler et al., *A GIS Framework for Spatio-temporal Analysis and Visualization of Laboratory Mice Tracking Data*, wwwdotonlinelibrarydotwileydotcom/.

c) Kritzler et al., *Analysing Movement and Behavioural Patterns of Laboratory Mice in a Semi Natural Environment based on Data collected via RFID-Technology*, wwwdotciteseerxdotistdotpsudotedu.

d) Lewe johann et al., *Behavioral phenotyping of a murine model of Alzheimer's disease in a seminaturalistic environment using RFID tracking*, wwwdotspringerlinkdotcom.

e) Kritzler et al, *Concept of a Framework for Moving Objects based on different Data Sources*, wwwdotdfki-dotde/web/forschung/publikationen.

f) U.S. Pat. No. 7,269,516 to Brunner et al, which describes a "A system and method used to assess animal behavior includes a module having sensors that collects a variety of physical and biological data from a test subject."

Additional references include:

1. Crawley, J. N., *Exploratory behavior models of anxiety in mice*. Neurosci Biobehav Rev, 1985. 9(1): p. 37-44.
2. Crawley, J. N., *Behavioral phenotyping of rodents*. Comp Med, 2003. 53(2): p. 140-6.
3. File, S. E., *Factors controlling measures of anxiety and responses to novelty in the mouse*. Behav Brain Res, 2001. 125(1-2): p. 151-7.
4. Holmes, A., et al., *Abnormal anxiety-related behavior in serotonin transporter null mutant mice: the influence of genetic background*. Genes Brain Behav, 2003. 2(6): p. 365-80.
5. Clement, Y., et al., *Anxiety in mice: a principal component analysis study*. Neural Plast, 2007. 2007: p. 35457.
6. Clement, Y., F. Calatayud, and C. Belzung, *Genetic basis of anxiety-like behaviour: a critical review*. Brain Research Bulletin, 2002. 57(1): p. 57-71.
7. Crawley, J. N., *Behavioral phenotyping of transgenic and knockout mice: experimental design and evaluation of general health, sensory functions, motor abilities, and specific behavioral tests*. Brain Res, 1999. 835(1): p. 18-26.
8. Crawley, A. C., *What's Wrong With My Mouse? Behavioal Phenotyping of Trasgenic and Knockout Mice*. 2000, New York: Wily-Liss.
9. Morris, R. G., *Episodic-like memory in animals: psychological criteria, neural mechanisms and the value of* episodic-like tasks to investigate animal models of neurodegenerative disease. Philos Trans R Soc Lond B Biol Sci, 2001. 356(1413): p. 1453-65.
10. Higgins, G. A. and H. Jacobsen, *Transgenic mouse models of Alzheimer's disease: phenotype and application*. Behavioural Pharmacology, 2003. 14(5-6): p. 419-38.
11. Carter, R. J., J. Morton, and S. B. Dunnett, *Motor coordination and balance in rodents*. Curr Protoc Neurosci, 2001. Chapter 8: p. Unit 8 12.
12. Carter, R. J., et al., *Characterization of progressive motor deficits in mice transgenic for the human Huntington's disease mutation*. J Neurosci, 1999. 19(8): p. 3248-57.
13. Sedelis, M., R. K. Schwarting, and J. P. Huston, *Behavioral phenotyping of the MPTP mouse model of Parkinson's disease*. Behav Brain Res, 2001. 125(1-2): p. 109-25.
14. Steele, A. D., et al., *The power of automated high-resolution behavior analysis revealed by its application to mouse models of Huntington's and prion diseases*. Proceedings of the National Academy of Sciences of the United States of America, 2007. 104(6): p. 1983-1988.
15. Markou, A., et al., *Removing obstacles in neuroscience drug discovery: the future path for animal models*. Neuropsychopharmacology, 2009. 34(1): p. 74-89.
16. Moreau, J. L., *Reliable monitoring of hedonic deficits in the chronic mild stress model of depression*. Psychopharmacology (Bed), 1997. 134(4): p. 357-8; discussion 371-7.
17. Konkle, A. T., et al., *Evaluation of the effects of chronic mild stressors on hedonic* and *physiological responses: sex* and strain *compared*. Brain Res, 2003. 992(2): p. 227-38.
18. Crawley, J. N., *Behavioral phenotyping strategies for mutant mice*. Neuron, 2008. 57(6): p. 809-18.
19. Rogers, D. C., et al., *Use of SHIRPA* and *discriminant analysis to characterise marked differences in the behavioural phenotype of six inbred mouse strains*. Behav Brain Res, 1999. 105(2): p. 207-17.
20. van der Staay, F. J. and T. Steckler, *Behavioural phenotyping of mouse mutants*. Behav Brain Res, 2001. 125(1-2): p. 3-12.
21. Ricceri, L., A. Moles, and J. Crawley, *Behavioral phenotyping of mouse models of neurodevelopmental disorders: relevant social behavior patterns across the life span*. Behav Brain Res, 2007. 176(1): p. 40-52.
22. Silverman, J. L., et al., *Behavioural phenotyping assays for mouse models of autism*. Nature Reviews Neuroscience, 2010. 11(7): p. 490-502.
23. Crawley, J. N., *Mouse behavioral assays relevant to the symptoms of autism*. Brain Pathol, 2007. 17(4): p. 448-59.
24. Benson, D. D., et al., *Gender-specific transfusion affects tumor-associated neutrophil: macrophage ratios in murine pancreatic adenocarcinoma*. J Gastrointest Surg, 2010. 14(10): p. 1560-5.
25. Menalled, L., et al., *Systematic behavioral evaluation of Huntington's disease transgenic and knock-in mouse models*. Neurobiol Dis, 2009. 35(3): p. 319-36.
26. Moy, S. S., et al., *Development of a mouse test for repetitive, restricted behaviors: relevance to autism*. Behav Brain Res, 2008. 188(1): p. 178-94.
27. DiCicco-Bloom, E., et al., *The developmental neurobiology of autism spectrum disorder*. J Neurosci, 2006. 26(26): p. 6897-906.
28. Mandillo, S., et al., *Reliability, robustness, and reproducibility in mouse behavioral phenotyping: a cross-laboratory study*. Physiological Genomics, 2008. 34(3): p. 243-255.
29. Brown, S. D., P. Chambon, and M. H. de Angelis, *EMPReSS: standardized phenotype screens for functional annotation of the mouse genome*. Nat Genet, 2005. 37(11): p. 1155.
30. Morgan, H., et al., *EuroPhenome: a repository for high-throughput mouse phenotyping data*. Nucleic Acids Research, 2010. 38(Database issue): p. D577-85.
31. Jhuang, H., et al., *Automated home-cage behavioural phenotyping of mice*. Nat Commun, 2010. 1(6): p. doi:10 1038/ncomms1064.
32. *A human pheromone?* Lancet, 1971. 1(7693): p. 279-80.

SUMMARY OF THE INVENTION

There is provided in accordance with an exemplary embodiment of the invention, a method for identifying and classifying social complex behaviors among a group of model organisms, comprising:
  automatically tracking a momentary position of each model organism in a group of over 8 organisms over a period of time to provide data;
  processing said data to identify a social relationship between at least two model organisms; and
  evaluating said comparison for identifying a behavioral phenotype in said model organism. Optionally, processing said data includes calculating for said model organism and said at least one or more other model organism, locomotion information.

In an exemplary embodiment of the invention, said social relationship comprises one or more of chasing, being chased, avoiding and being avoided. Optionally, the method comprises extracting a social hierarchy from said analyzed data.

In an exemplary embodiment of the invention, the method comprises automatically quantifying said social relationship.

In an exemplary embodiment of the invention, processing said data includes generating at least one behavioral parameter based on history.

In an exemplary embodiment of the invention, processing said data includes generating at least one behavioral parameter based on a plurality of other behavioral parameters.

In an exemplary embodiment of the invention, processing said data includes calculating for said model organism any one of, or any combination of, activity/resting time, circadian activity pattern, sleeping/resting time, mean velocity, daily travel distance, time chasing, time being chased.

In an exemplary embodiment of the invention, said automatic tracking includes use of video imaging.

In an exemplary embodiment of the invention, said video imaging is at a frame speed greater than 10 frames per second.

In an exemplary embodiment of the invention, said tracking includes use of radio frequency identification (RFID) technology. Optionally, said RFID tracking includes a spatial resolution of better than 5 cm. Optionally or alternatively, said tracking comprises fusing video tracking and RFID identification information.

In an exemplary embodiment of the invention, said tracking includes tracking in the dark.

In an exemplary embodiment of the invention, said large group is contained in an enclosed space.

In an exemplary embodiment of the invention, said large group includes mice, rats or fish.

In an exemplary embodiment of the invention, the method comprises classifying said model organism based on said behavioral phenotype.

In an exemplary embodiment of the invention, said evaluating comprises evaluating based on both non-social behavior of the model organism and on social behavior of the organism.

There is provided in accordance with an exemplary embodiment of the invention, a method of identifying and classifying social complex behaviors among a group of model organisms, each having a permanent affixed or implanted RFID transponder, comprising:

enclosing said large group of model organisms in a monitored space divided into RFID monitored segments;

RFID tracking a position of each model organism by reading said at least one RFID transponder in each model organism over a period of time;

capturing a sequence of images of each model organism over said period of time; and calculating at least one spatiotemporal model of each model organism based on time synchronization of said RFID tracked position of said model organism with said sequence of images. Optionally, said social complex behavior includes aggressive behavior. Optionally or alternatively, said social complex behavior includes social hierarchy. Optionally or alternatively, said spatiotemporal model includes calculating a best path for each model organism. Optionally, said best path is calculated by extrapolating between imaged positions of each model organism in at least a portion of said sequence of images and predicted positions.

In an exemplary embodiment of the invention, said RFID tracking includes determining an amount of time each model organism spends in a same segment. Optionally or alternatively, said RFID tracking includes reading said at least one transponder as each model organism moves across segments. Optionally or alternatively, the method comprises outputting said at least one spatiotemporal model.

In an exemplary embodiment of the invention, said calculating comprises fusing video data and RFID data. Optionally, said fusing comprises using RFID data to assist in clustering video data. Optionally or alternatively, said fusing comprises using video data to improve a trajectory provided by RFID data.

In an exemplary embodiment of the invention, capturing a sequence of images comprises generating a reference image based on a plurality of images acquired while said organisms are being imaged.

There is provided in accordance with an exemplary embodiment of the invention, a system, comprising:

an enclosed space for accommodating a group of at least model animal organisms, each model organism having at least one RFID transponder;

a plurality of RFID readers distributed such that their RF coverage divides said enclosed space into RFID monitored segments;

an imaging system for capturing a sequence of images of said enclosed space; and a processor configured to provide one or both of (a) at least one spatiotemporal model for each model organism in said large group and (b) combine RFID data and imaging data for a plurality of model organisms in said group. Optionally, said imaging includes infrared illumination.

In an exemplary embodiment of the invention, the system comprises a data storage unit for storing said sequence of images and readings from said plurality of RFID readers. Optionally or alternatively, said processor is configured to provide both of said (a) and (b).

In an exemplary embodiment of the invention, said processor is configured to automatically classify a phenotype or quantify a behavior of said animal.

In an exemplary embodiment of the invention, said processor is configured to automatically extract social behavior for a plurality of animals. Optionally, said processor is configured to automatically build a social hierarchy tree for said plurality of animals.

In an exemplary embodiment of the invention, said processor is configured to collect information correlated with a treatment of said animals.

In an exemplary embodiment of the invention, the system is configured to identify and classify social complex behaviors among said group.

In an exemplary embodiment of the invention, the system is configured to identify one or more trigger conditions and to store data, collect data and/or control an actuator in the system, in response thereto.

In an exemplary embodiment of the invention, said enclosure comprises a large environment of an area matching a natural habitat size for said group.

In an exemplary embodiment of the invention, the system is configured to track a vertical component of position in at least part of said enclosure.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings and images. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIGS. 1A and 1B are a top view and a perspective view of an animal monitoring system, in accordance with an exemplary embodiment of the invention;

FIG. 2A is a plan view of the system of FIG. 1;

FIGS. 2B and 2C are schematic showing of electronic cards for use in the system of FIG. 1, in accordance with an exemplary embodiment of the invention;

FIGS. 3A-3B are screen shots for a control software for use in the system of FIG. 1, in accordance with an exemplary embodiment of the invention;

FIG. 4 is a flow diagram showing data fusion using RFID position data and video surveillance data, in accordance with an exemplary embodiment of the invention;

FIG. 5 is a schematic of a screen shot generated using the method of FIG. 4, showing identified mice and other objects in a stage, such shown in FIG. 1, in accordance with an exemplary embodiment of the invention;

FIG. 6 is a flow diagram showing how fused data and RFID data may be used for behavioral classification, in accordance with an exemplary embodiment of the invention;

FIG. 7 is a schematic top view of a stage, in accordance with an exemplary embodiment of the invention;

FIG. 8 is an image captured of the stage shown in FIG. 7, in accordance with an exemplary embodiment of the invention;

FIG. 9 is an image of a mask formed of the stage shown in FIG. 7, in accordance with an exemplary embodiment of the invention;

FIG. 10 is a composite amplitude image formed of the stage shown in FIG. 7, in accordance with an exemplary embodiment of the invention;

Figure 7:
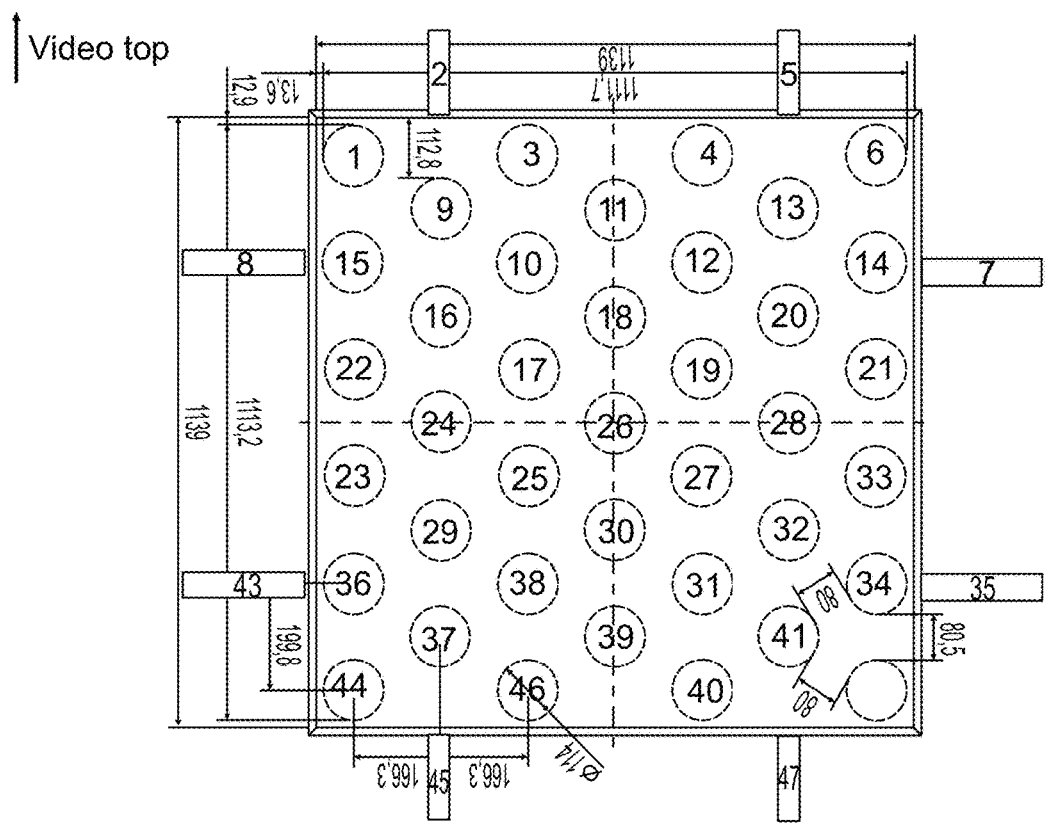
Figure 11:
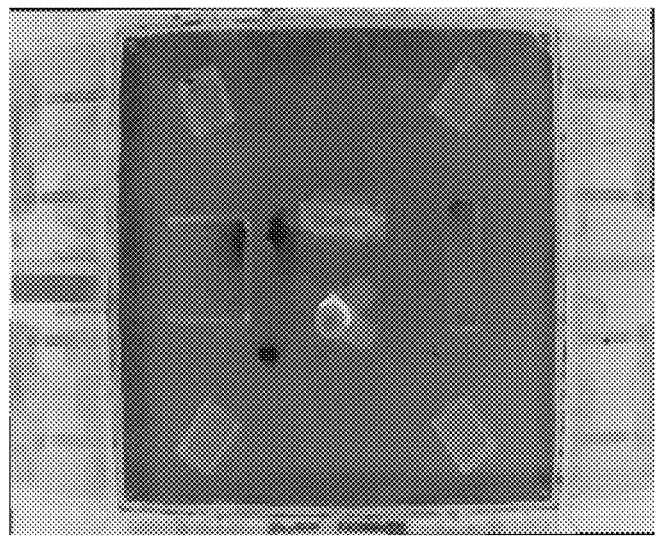
Figure 12:
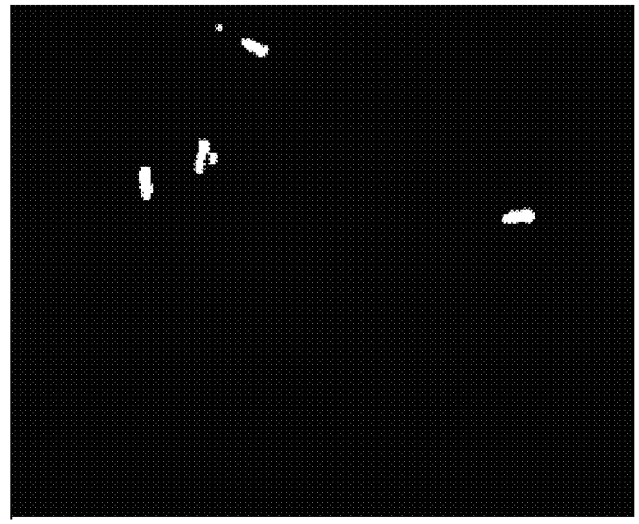
Figure 13:
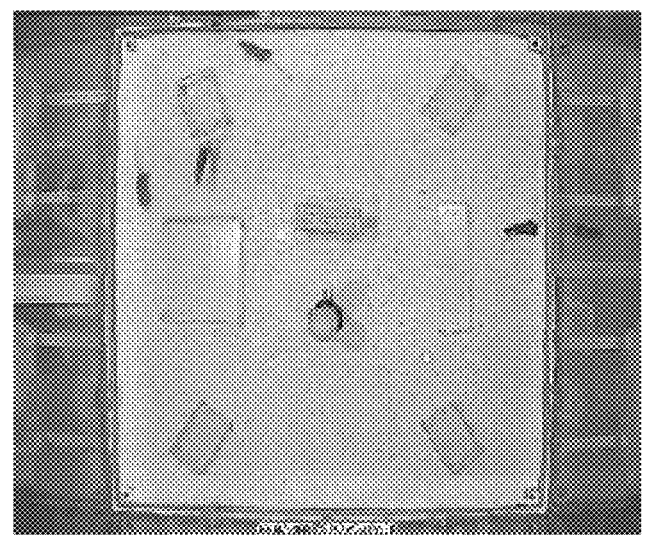

FIG. 11 is a minimum image formed of the stage shown in FIG. 7, in accordance with an exemplary embodiment of the invention;

FIG. 12 is a foreground image formed of the stage shown in FIG. 7, in accordance with an exemplary embodiment of the invention;

FIG. 13 is a source frame image formed of the stage shown in FIG. 7, in accordance with an exemplary embodiment of the invention;

FIG. 14 is a calculated image showing identified mouse locations on the stage shown in FIG. 7, in accordance with an exemplary embodiment of the invention;

FIG. 15 shows pixels of two mice, as calculated in accordance with an exemplary embodiment of the invention;

FIG. 16 shows pixels of two overlapping mice, as calculated in accordance with an exemplary embodiment of the invention; and FIG. 17 shows identification of mice in an instant frame (lower case letters) and a previous frame (upper case letters), as calculated in accordance with an exemplary embodiment of the invention.

DESCRIPTION OF SPECIFIC EMBODIMENTS OF THE INVENTION

The present invention, in some embodiments thereof, relates to animal model tracking, for example, for behavioral phenotyping and, more particularly, but not exclusively, to a method and apparatus for automatically classifying behavioral phenotypes in model organisms from single to multiple socially interacting individuals.

An aspect of some embodiments of the present invention relates to a method for automatically identifying and quantifying behavioral phenotype changes, including abnormalities, in a multi-unit group of model organisms, for example, including 2, 3, 4, 5, 10, 20 or smaller or intermediate or greater numbers. Optionally, the number of model organisms is at least 10%, 30%, 50%, 100%, 200% or intermediated or greater percentages of a social unit size of the model organisms (e.g., a family unit). In an exemplary embodiment of the invention, the method is based on recording spatiotemporal data of a plurality of model organisms in a monitored space under diverse environmental conditions and over a time frame which may range, for example, from a few minutes to hours or days. The diverse environmental conditions may include during breeding, in situ, before treatment, during treatment, and following treatment. The spatiotemporal data is analyzed for identifying and quantifying complex social behaviors, such as for example, social interaction, aggressive behavior, dominance-subordinate hierarchy, olfactory investigation and sexual behavior, between multiple members of the group.

In an exemplary embodiment of the invention, the environment is a large environment, which may allow more natural behavior of the model organisms. For example, the environment may be, for example, 1 Square Meters, 2 sqm, 4 sqm, 10 sqm or intermediate or greater areas. In an exemplary embodiment of the invention, the environment has a size which is at least 10%, 30%, 50%, 100%, 200% or intermediate or greater percentages of a natural range of the model organism and/or of a group thereof. In an exemplary embodiment of the invention, the environment is large enough to define at least 2, 3, 4, or more territories of the model organism and/or group. Optionally or alternatively, the environment includes various elements, such as hiding places, food, tunnels, exercises and/or experiments.

It is noted that in some embodiments, data is collected and/or analyzed and used, for example, for evaluating monitoring and/or tracking one or more behavioral parameter of one or more single animals. Optionally, social parameters are not evaluated and/or tracked and/or used.

An aspect of some embodiments of the present invention relates to methods and systems of monitoring complex social behaviors among a plurality of model organisms to extract a mathematical model for quantifying and/or classifying normal and/or abnormal behavioral phenotypes.

In an exemplary embodiment of the invention, the methods, for example, are based on radio frequency identification of each of the plurality of model organisms for tracking each model organism's movement in a monitored space that is divided into a plurality of RFID monitored segments. Optionally or alternatively, the methods are also based on simultaneously tracking movement of each model organism within the monitored space by capturing a sequence of images of each model organism, for example, using infrared illumination or other illumination not visible to the model organisms. Alternatively, other types of illumination may be used, for example, white light. Alternatively, image capturing does not require additional illumination, for example, when using a heat-based imaging device. Optionally, the infrared imaging device may be adapted to perform thermal imaging.

In a particular exemplary embodiment of the invention, information about the model animals is provided by fusing data collected by RFID or other personal animal tracking technology with video frames. In an exemplary embodiment of the invention, position and/or identification is provided by the RFID data with more precise spatial information, such as trajectory, body posture and/or other properties, provided by image processing. In one example, this allows for calculating a spatiotemporal model based on time synchronized fusing a detected position of each model organism based on radio frequency identification, with its calculated best path extrapolated from sequentially imaged positions and predicted positions.

In an exemplary embodiment of the invention, from the spatiotemporal model may then be extracted behavioral repertoires including, for example, one or more of, exploration patterns, circadian rhythms, anxiety-like behaviors, stereotypic behaviors, food and water consumption, and social interactions such as collision avoidance with objects or other mouse, chasing behaviors, sociability level, and group coordination.

In some exemplary embodiments, the method allows for identification and classification of locomotion/exploratory behaviors by analyzing for each model organism in a group of model organisms, for example, one or more of daily travel length, activity/resting time, mean velocity, circadian activity pattern, sleeping/resting time, activity variance between days, and/or activity correlation with other members.

Optionally or alternatively, anxiety-like behaviors may be identified for each model organism by analyzing time active in a peripheral versus central region of a relatively large enclosed area, and time spent in sheltered areas.

Optionally or alternatively, social interactions between individual model organisms may be identified and classified by analyzing sociability behavior (for example, by analyzing percentage of time in proximity to other model organisms versus time spent alone); time chasing and/or being chased by other model organisms (for example, by analyzing when the distance between two moving organism is small and they move at a relative constant velocity and similar trajectories); time spent investigating a stranger (for example, between a male and a female model organism); aggressive chasing behavior, dominance status index (for example, time chased vs. time being chased); and/or female-male social/sexual interactions.

In some exemplary embodiments, the method includes collectively housing the group of model organisms in a relatively large enclosed area and tracking the momentary position of each model organism over a period of time. Optionally, a sheltered area is included for providing refuge to a model organism.

In some embodiments of the invention, body posture of one or more model organisms is monitored. Optionally, direction of body orientation is monitored. Optionally or alternatively, body contour is monitored.

In some exemplary embodiments, tracking includes synchronizing video imaging with radio frequency identification of the position of one or more, possibly all, model organisms at a given moment of time. A potential advantage of using video imaging is that the exact position of each mouse may be known at all times. RFID may be less accurate, may require overlap with an RFID reader and/or high accuracy may be expensive. Another potential benefit of video imaging is that it allows monitoring of behavioral aspects of the mice which are not monitorable by RFID, for example changes in posture (standing, lying, jumping), body orientation, and the like. Another potential benefit of video imaging is that it allows for video sequences to be extracted manually for review by the researcher. Optionally, video imaging can be set up to track an RFID generated position, for example, by changing a line of sight of the camera and/or zooming into the position. Optionally, one or more dedicated imagers are used for this. Optionally or alternatively, one or more directional and/or narrow angle sensors, for example, thermal sensors or acoustic sensors are provided in boresight with the camera and/or aimable based on camera and/or RFID position and aimed at a member to collect additional information. Optionally or alternatively, sensors in the system are operated according to animal position. For example, air for chemical analysis may be extracted only from a location where the animal is located, by, for example, operating a valve to open a tube only at such location, with multiple (e.g., an array of) tubes (not shown) provided in multiple locations of the system. Other such multiple sensors may be selectively activated as well, for example, based on RFID and/or video data and/or other collected information.

Alternatively or additionally to using RFID, other tracking methods, or any combination of tracking methods, for example as known in the art and suitable for identifying the position of one or more members at any given moment of time, may be used. Optionally, video imaging may be synchronized with any of the alternative tracking methods. Optionally, the tracking methods may include other forms of electromagnetic detection such as, for example, light sensing, or capacitance sensing.

An aspect of some embodiments of the invention relates to an animal tracking system, which can be used, for example, to carry out monitoring methods according to some exemplary embodiments. In an exemplary embodiment of the invention, the system is configured for automatically tracking an X-Y position and body posture of individual rodents, for example, mice, inside a large enclosure surrounded by shelters. The system allows simultaneous tracking of a large group (e.g., >10) of freely interacting mice under white light or infrared illumination without any visual marking on the mouse fur. The system synchronizes video images with RFID data collected using high spatial (<2 cm) and temporal (~150 readings/sec) resolution. Optionally, the system allows one or more mice to be located inside the enclosure using RFID and/or video imaging. Additionally, the system may allow generating a "clip" of any desired length showing a particular mouse or plurality of mice, for example a pair of mice, or a specific group of mice.

In some exemplary embodiments, the system includes a processor which analyzes the synchronized RFID data and imaging data and determines the trajectory of each mouse. Optionally, this information is then combined with information related to the behavior of the mice for determining behavioral identification and classification. Optionally, the processor includes custom designed software written in Labview using Opencv vision tool and Matlab using image processing toolbox.

An aspect of some embodiments of the invention relates to an automated animal tracking system which can use triggers to perform actions, including, for example, one or more of data collection, additional sensory data collection, sending alerts to a user, operating shelters, operating experiments, providing food, releasing and/or trapping animals and/or providing a signal to operate other modules and/or machines. Optionally, the system can be programmed to perform activities, for example, according to a script and/or predefined periods and/or rules (e.g., pattern/response rules, with patterns, for example, being defined according to measured and/or calculated parameters).

Optionally, the triggers are used to generate an interrupt or change a parameter value which affects such logic. In particular, scripts (e.g., javascript, matlab), rules, etc. may be defined to be applied to particular animals and/or particular locations and/or particular times.

In an exemplary embodiment of the invention, a trigger may be defined based on a matchup of one or more of a time, animal ID (or group) and/or space with each other and/or with predefined thresholds and/or functions and/or values defined, for example, by a script. Optionally, a trigger is defined based on extracted data, for example, based on identified social behavior, such as chasing behavior, for example, a chasing event may be a trigger, a chasing event lasting more than a threshold time may be a trigger and/or a chasing event rate over 5/hour may be a trigger. Optionally or alternatively, the triggers are different for different animals. Optionally or alternatively, a trigger may include the confluence of several specific animals and/or properties (e.g., animal 5 chasing animal 3 or animal 5 sleeping within 3 hours from being given material A) and/or groups of animals (e.g., animal 5 chasing any female given material D in a window of between 1 and 2 hours ago).

In an exemplary embodiment of the invention, experiments to be performed may be defined and applied by the system when the animal complies. For example, an experiment may require that a mouse be chased for 20 seconds and then hide, before commencement. The system detects when a mouse (or a particular mouse) is chased and hides and then applies the experiment in the hiding location, for example, providing food in a shelter in which the mouse is hiding, or opening a tunnel from the shelter to a box in which the experiment is performed. In another example, a researcher is alerted when animals are ready, for example, having eaten, slept and/or coupled. In another example, a researcher needs to collect data about certain behaviors and sets up the system to specifically and separately store data according to his specifications.

For example, in some exemplary embodiments, the processor is able to control the environment of the mice by controlling opening and closing of access doors; controlling food/water/drug/treatment administrating devices; controlling light, sound and other sensory stimulating devices. Optionally, the processor is able to control the environment of one particular mouse, or of a subgroup of mice. Optionally, the processor is able to individually control different environments for one mouse, a subgroup of mice, or for the whole group of mice. Additionally or alternatively, simultaneous control of the different environments is possible.

An aspect of some embodiments of the invention relates to a data fusion method in which video data and RFID or other ID data are fused. In an exemplary embodiment of the invention, RFID data is used to cluster pixels identified in the video data to individual animals and/or distinguish between two nearby animals whose images overlap. Optionally, clusters are split and/or identified based on their size and/or shape.

A particular advantage of some embodiments of the invention is that the monitored animals may be moving faster than can be reliably detected by RFID. Video image information is optionally used to compensate for this, for example, by detecting "missing" mice. Optionally or alternatively, RFID information is optionally used to assign all or most video detections to known mice locations, so as to reduce the complexity of the task. Optionally or alternatively, by using both video and RFID tracking data from one modality can be used to better process data and/or reduce complexity of such processing from the other modality.

A particular advantage of some embodiments of the invention is that relatively low-accuracy RFID antennas may be used, for example, with an accuracy of 20 cm, 10 cm, 8 cm or intermediate or better accuracy. Higher accuracy antenna may be used as well, for example, with an accuracy of 5 cm, 3 cm or intermediate or better accuracy. For some uses low accuracy is sufficient. For some uses, video images are used to provide positional accuracy by assigning a more precise location (e.g., 3 cm, 1 cm, 0.5 cm or intermediate or better accuracies) to a mouse generally detected and identified using RFID tracking. It is noted that even higher accuracy RFID may have a lower effective accuracy due to missed readings and/or mouse motion speed.

In an exemplary embodiment of the invention, trajectories calculated using RFID position data are fused with trajectories calculated using video analysis.

In some embodiments, estimated and/or historical data is used when data is missing from a time frame. Optionally or alternatively, the severity of missing data and/or accuracy of existing data is judged based on how repetitious the data is, based on animal speed and/or based on a time stamp difference between that data and other data. Optionally, RFID position data is used to separate overlapping video data.

In an exemplary embodiment of the invention, video image processing uses a learned background image, which is optionally generated while animals are moving, optionally based on an average image and/or based on minimum and/or maximum values for pixels over time.

An aspect of some embodiments of the invention relates to behavioral mapping. In an exemplary embodiment of the invention, mapping comprises collecting behavioral data continuously, optionally in a large environment. Optionally, this includes collecting data both from locations where the animal is visible and from locations where the animal is invisible, for example, using RFID detectors inside hiding places. Optionally or alternatively, simultaneous multiple activities of an animal are extracted, for example, exploratory and avoidance behavior.

In an exemplary embodiment of the invention, by tracking chasing activity, a social hierarchy tree is automatically built.

An aspect of some embodiments of the invention relates to automatic classification and/or evaluation of model organisms by tracking multiple behavioral characteristics, such as two or more of hiding, running, walking, sleeping, being still, being avoided, avoiding others, chasing, chased, location in social hierarchy and/or changes in any of the above, for example, spontaneous and/or due to introduction, optionally automatic, of other animals. In an exemplary embodiment of the invention, a machine learning, principal component analysis and/or clustering method is used to divide up animals according into groups and/or match up an animal with previously stored behavior for an animal type. For example, it is possible to detect when an animal changed enough to be, for example, 2 standard deviations different from its original phenotype (e.g., due to administration of a drug), the location of an animal along a behavioral scale and/or when the animal joined another predefined group, based on its behavior.

A potential advantage of some exemplary embodiments of the invention is that it may provide a single tool for automatically identifying and quantifying large scale behavioral phenotype changes, including abnormalities, of a wide range of animals, (possibly with modification for specific animal types) under diverse environmental conditions and using time frames which extend from minutes to even as much memory space as may be available. In some embodiments, the method may be used with laboratory rats, fish or any other organism, and/or may allow multidisciplinary researcher groups to perform a comparable large throughput behavioral functional annotation of the mouse genome, and/or to relatively easily screen for different genetic and environmental factors that may be involved in a wide range of behaviorally related human heritable diseases.

In an exemplary embodiment of the invention, methods and/or apparatus as described herein are used to provide a robust standardized tool for biotech and drug companies to assess the consequences of toxicology, pharmacology, genetic or physiology and/or treatments on large scale mouse models. In some embodiments, the method allows for quantification of the behaviors previously described for specified timeframes (e.g. minutes/hours/days/weeks) and social conditions (male-male, female-female, female-male) in a similar way for each genotype/strain/gender of tested mice.

In an exemplary embodiment of the invention, the methods and/or apparatus provided in accordance with some embodiments of the invention, support one or more of screening for changes in complex social behaviors, such as social interaction between multiple individuals, aggressive behavior (e.g., number of chasing events and/or attacks per hour), dominance-subordinate hierarchy, olfactory investigation and sexual behavior, and/or other changes such as changes which have been relatively less studied on mutant mouse models for various socially-linked mental disorders.

It is possible that the limited information available in the art on the social behavioral phenotype of mutant mouse models may be for two reasons, one or both of which may be overcome using some embodiments of the present invention. The first may be that rigorously characterization of the behavioral phenotype of a neurodegenerative mouse models, such as ASD (Autism Spectrum Disorder), Alzheimer, mood disorders, and anxiety related disorders are a complex task since they require a large battery of independent behavioral methodologies to be used, including numerous assays to measure anxiety-like behavior, repetitive behavior, locomotion/exploratory behavior, sociability, and vocal communication [2, 7, 18-25]. Automated and/or semi-automated collection as described herein may assist in this regard. The second may be that providing comprehensive knowledge on the behavioral phenotype of a specific ASD mouse model by human-observer manual scoring of mouse video data is expensive, time-consuming, and requires human experiments with high behavioral expertise and ability to follow a rigid standardize methodology to provide reproducible valid data [28-30]. For example, it was recently estimated that 22 person-hours are required to manually score 1-hr video of basic mouse behaviors in a standard small cage [31, 32]. Again, automated and/or semi-automated collection as described herein may assist in this regard.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Following is described a system for automatically phenotyping behavior of mice, according to some exemplary embodiments of the present invention. Nevertheless, it is to be understood that the invention is not necessarily limited in its application to the details of construction and the arrangement of the components and/or methods set forth in the following description and figures. The invention is capable of other embodiments or of being practiced or carried out in various ways.

Figure 1B:
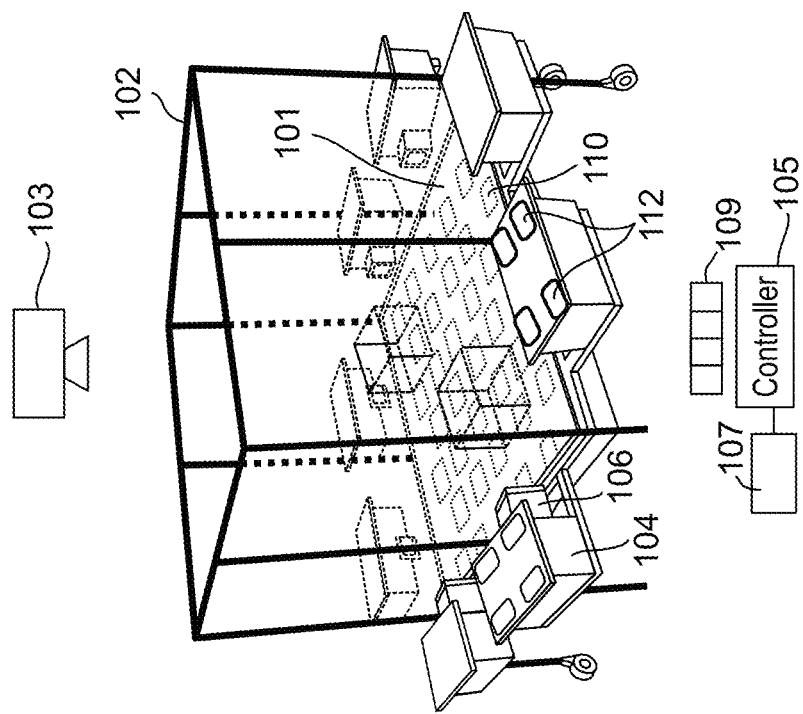
Figure 1A:
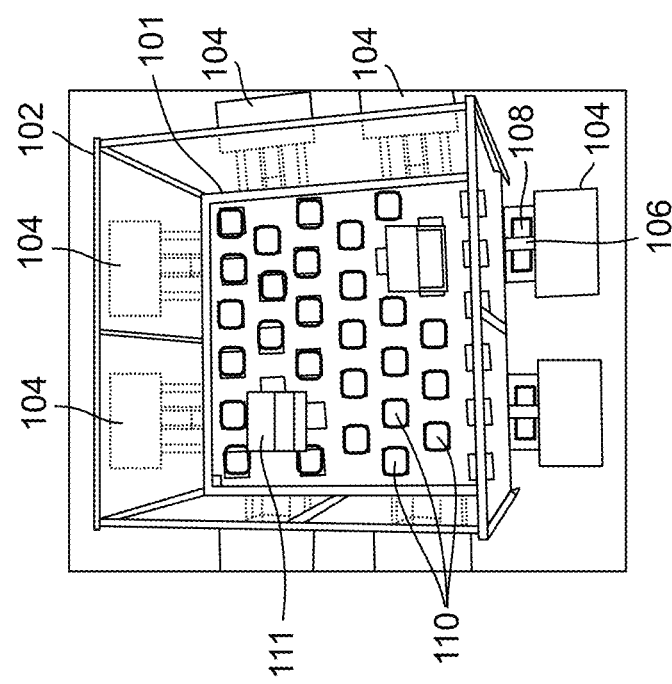

FIGS. 1A and 1B are a top view and a perspective view of an animal monitoring system and enclosure 100, in accordance with an exemplary embodiment of the invention. As schematically illustrated in FIG. 1, system 100 includes an enclosure 102 having a central exploratory arena 101 sufficiently large for accommodating a colony of mice freely interacting with one another, and one or more (e.g., 2, 4, 6, 8 or intermediate or greater numbers) of optional side cages 104 (e.g., for nesting and/or for other purposes, such as experimentation and/or collection of biological data) peripherally attached to, and connecting with, the arena. Optionally, one or more objects 111 are provided in the arena, for example, feeding stations, water stations, hiding places, sleeping locations, exercise elements such as a treadmill, nests and/or experimental boxes.

In an exemplary embodiment of the invention, system 100 also includes at least one RFID sensor, shown here as antennas (e.g., 110 in arena 101, and/or antennas 112 above and/or below (in) cages 104 and/or antennas 108 on passageways 106 between cages 104 and arena 101), and one or more video imagers 103, optionally viewing from above. Also shown in this figure is a controller 105 used to collect data and/or apply activities to system 100, for example, as described herein, for example, using one or more sensor arrays 109 and/or using one or more actuatable elements 107. Connections between system elements may be, for example, wired. Optionally or alternatively, at least some connections are wireless.

Also not shown and optionally provided are one or more environmental control systems, for example, a heater (e.g., bottom or air blowing), a cooler, an air blower to simulate wind, a sound generator, moving illumination (or a series of lamps illuminated under controller control), a gas source, to control atmosphere gas composition, artificial rain and/or humidity. Such control may be provided globally to arena 101 and/or one or more cages 104 and/or may be provided locally, for example, to a part of arena 101 and/or to a subset of cages 104.

In an exemplary embodiment of the invention, the colony may include at least 10 mice, for example 12 mice, 15 mice, 20 mice, 25 mice, 30 mice, 50 mice, 100 mice, or intermediate or greater numbers of mice and/or other rodents, such as rats. The enclosure may include walls, and optionally a top, preferably made of a relative transparent material suitable for allowing proper illumination and video recording. The arena may be quadrilateral shaped. Alternatively, the arena may include other geometrical shapes, for example, it may be circular, triangular, pentagonal, hexagonal, octagonal, or other polygonal shape. Optionally or alternatively, the arena includes rocks and/or other objects and/or has a walled shaped which provides a more natural and/or less stressful environment.

In an exemplary embodiment, the enclosure is of dimensions 114×114×80 cm (L×W×H cm) and constructed of transparent polycarbonate boards attached to each other by aluminum square rods (for example, Kanya). Optionally, the enclosure may be larger in size. Alternatively, the enclosure may be smaller in size. Optionally or alternatively, the enclosure is modular, so that modules including, for example, RFID detectors, an arena section 101 and/or an imager, can be connected together, with cages 104 attached to the sides and walls mounted on the outside periphery. Optionally or alternatively, walls may be provided within arena 101. In such a case, a modular connection may take several systems and, for example, use passageways 106 to interconnect different arenas. Optionally or alternatively, tunnels (not shown) may be used to connect arenas and/or connect an arena to an experimental box. Hatches may be provided to, optionally automatically, under control of the controller, block and/or allow access through passageway 106 and/or such tunnels. Optionally, hatches are used to provide gated access (Optionally, based on mouse RFID and/or system control) to one or more of food, tunnels to boxes where experiments are carried out and/or physiological measurements made (e.g., to track weight or metabolism thereof) and/or exits from boxes.

In an exemplary embodiment, cages 104 are two mouse nesting cages (for example, standard type cages having dimensions 15×23×15 cm), which are peripherally connected to each side of the arena through passageways 106 which lead into the interior of the arena. Optionally, only one cage is peripherally connected or alternatively, more than two cages are connected, for example, 3, 4, 5, 8, 10 cages or more. Alternatively, nesting cages are connected to only some sides of the arena. Optionally, the passageways include a transparent material for viewing the mice moving between the cage and the arena, such as, for example, Perspex.

In an exemplary embodiment of the invention, passageways 106 include an access door that may be operated in several modes. Optionally, the modes include any one, or any combination of, the following:
 a) allowing free in/out access to all mice between the arena and the peripheral nesting cages;
 b) blocking access between the arena and the nesting cages; and
 c) allowing one way access from the nesting cages to the arena or vice versa.

Optionally, RFID controlled gates may be installed in each of the connecting passageways such that the entrance/exit to each cage is allowed only for specified mice. e.g., as shown in Winter, Y. and A. T. Schaefers, *A sorting system with automated gates permits individual operant experiments with mice from a social home cage*. J Neuroscience Methods, 2011. 196(2): p. 276-80].

In some exemplary embodiments, the enclosure's floor (arena 101) may be of a material suitable for preventing light reflection of IR illumination placed above the arena, or may be covered with a material having the same suitability, for example a white opaque plastic sheet. Optionally, the arena is covered with sawdust bedding, and/or may include a variety of shelter boxes/tubes for the mice. The enclosure may include a feeding/drinking system for allowing the mice free access to food (e.g., rodent pellets) and water.

In an exemplary embodiment of the invention, system 100 includes a Radio-Frequency-Identification (RFID) tracking system and an imaging system 103 which operate automatically and in synchronization for calculating mouse trajectories in the arena and for classifying behavioral phenotypes.

In some exemplary embodiments, the image acquisition system enables mouse behavior to be observed and captured in darkness.

Exemplary RFID System for Tracking Position and/or Identity

In some exemplary embodiments, the RFID tracking system includes a plurality of RFID antennas and readers (decoders) which are distributed throughout the enclosure and which serve to monitor (and register) location of each mouse inside arena 101, during movement in and out of nesting cages 104, and/or inside nesting cage 104. Optionally, the antennas define distinct area. Alternatively, there may be overlap between coverage areas of nearby (or other) antennas and/or dead spaces may be allowed.

In an exemplary embodiment of the invention, a subcutaneous transponder (e.g., a chip) is implanted in each mouse to be tracked. Optionally, the number of chips implanted in a mouse is greater than 1, for example 2, 3, or more. Optionally, an exemplary transponder chip is a type ID-100 for example, as known in the art. The transponder chips may be implanted in the head and/or the rear section of each mouse. Optionally, use of multiple chips and/or at multiple orientations allows a better signal to be received and/or more information about the mouse, such as orientation, to be extracted.

Optionally, RFID antennas are also used to monitor/register mouse movement perpendicularly to the ground (jumping/standing on hind legs), for example, based on change in intensity and/or relative intensity of transponders in a single mouse. Optionally or alternatively, vertical position of a mouse is provided using antennas on a top of the enclosure, possibly with lower accuracy for X-Y position. Optionally or alternatively, signals from multiple antennas are processed together, for example, using triangulation based on detected power amplitude, to estimate mouse horizontal and/or vertical position.

Figure 2A:
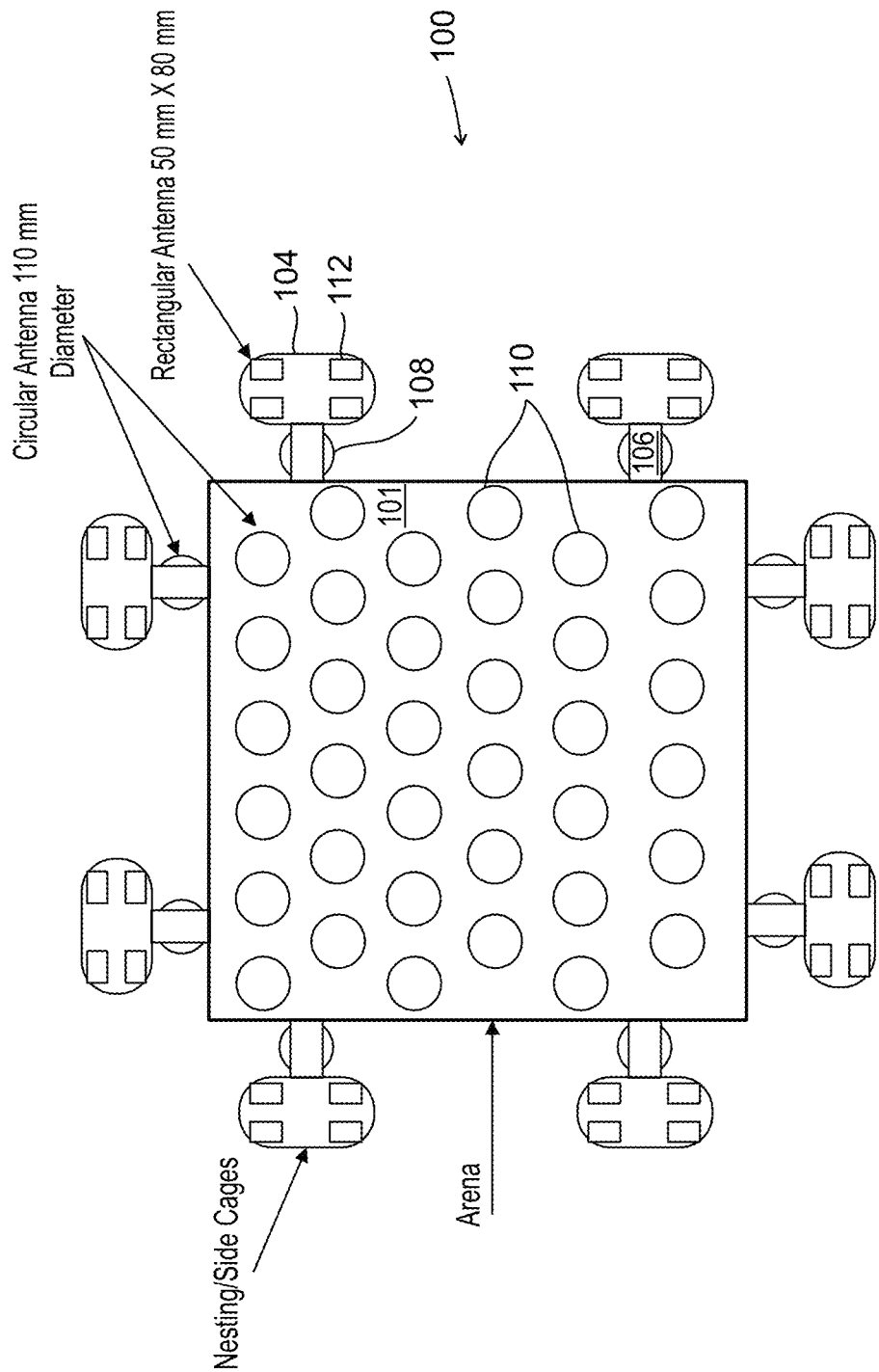

In some exemplary embodiments, some RFID antennas are arranged in an array (see FIG. 2A) underneath arena 101, underneath passageways 106 that connect arena 101 to cages 104 and/or on the top cover corners (or other upper locations) of each cage 104. In an exemplary embodiment, the plurality of antennas includes 79 RFID antennas of which 39 are under the arena, 8 underneath the passageways, and 32 antennas arranged in groups of 4 each group installed over the nesting cages covers.

In some exemplary embodiments, data collected through antennas 108 associated with passageways 106 is used to estimate time spent in sleeping cage alone and/or with other individuals.

In an exemplary embodiment, 55 RFID readers are used of which 8 readers are connected to the antennas of the nesting cages passage tubes, 8 readers are connected to the nesting cages top cover antennas (see FIG. 2B), and 39 readers are connected to the antennas within the arena (see FIG. 2C). Thus, for example, a single RFID reader may be connected to multiple antenna, if they cover a same location (e.g., a passageway 106 or a cage 104).

In some exemplary embodiments, a processor is included for processing acquired RFID data received by the readers including data associated with mice location and movements. The processor may include a PC, a laptop computer, a workstation, or any other data processing device suitable for collecting and processing the acquired data from the readers.

In an exemplary embodiment of the invention, dedicated electronic cards are used to collect information from the readers and multiplex and/or stream the data to the processor and/or process the data and send it to a general purpose computer.

In an exemplary embodiment of the invention, one or more dedicated antennas, possibly, with a short range, are provided on objects, such as a climbing tree, a limb and/or a treadmill, to identify when the object is occupied.

Optionally or alternatively to RFID sensors, other, non-location sensors, may be provided, for example, substrate samplers (e.g., to remove sawdust), smell sensors, chemical sensors, wetness sensors, weight sensors, acoustic sensors and/or ultrasonic sensors (e.g., for imaging). Such sensors may be activated, for example, as desired. Optionally, an array of such sensors is provided, for example, more than 10 and/or less than 100 per arena. Optionally or alternatively, to sensors, one or more actuators may be provided, for example, as an array or individual actuators, for example, to blow air, make a noise, expose a smell such as cat urine or a female pheromone, display an light or image and/or provide a shock.

Exemplary RFID Antenna

In an exemplary embodiment of the invention, antennas 110 and 108 are circular antenna having a diameter of, for example, 100 mm. Antenna 112 are rectangular antenna having dimensions of 50 mm by 80 mm each. Other sizes may be used as well.

In an exemplary embodiment, the antennas are round with a diameter of 110 mm and an inductance of approximately 380 µHy, optionally tuned particularly to each reader (decoder). The antennas are enclosed in a PVC case and are positioned with respect to one another at a distance of 195 mm center to center. Optionally, the 8 antennas located under each passageway are of the same shape. These antennas detect mice movements into and out of the nesting cages.

In an exemplary embodiment detection of mice jumping/standing at the corners of the nesting cages is done through a rectangular antenna of 50×80 mm located on top of each corner. Detection of a particular corner inside each cage may be considered irrelevant so that the 4 antennas in each nesting may be connected in any suitable configuration providing a desired inductance, for example, 2 in series and 2 in parallel to obtain the required inductance of 380 µHy. Optionally, for the 8 nesting cages, a total of 32 antennas are used. Alternatively, a greater or lesser number of antennas may be used for each nesting cage to achieve the desired inductance, and therefore the total number of antennas for all nesting cages may vary accordingly.

In some exemplary embodiments, a number and duration of repeated jumping in the corners of the nesting cages is identified and scored using the antennas positioned on each cage's corner. Optionally, the antenna detects the ID microchip (transponder) implanted in the mouse's dorsal part of the head (the transponder is detected when the mouse's head is within less than 2 cm distance from the cage cover, i.e. only when the mouse jumps up and down on its rear feet).

Exemplary RFID Readers

In an exemplary embodiment, the reader includes the LID650 with a single antenna driver type TM613 mounted as piggyback, manufactured by Dorset (Trovan) Electronic Identification Systems. This reader is suitable for reading from the ID-100 transponder implanted in the mice. The average continuous current per decoder is 70 ma. Optionally, reading rate is 24 msec or 41 readings per second for a single continuously transmitting data.

In an exemplary embodiment of the invention, the communication protocol used is the asynchronous 2 wire RS485 at the highest available Baud Rate of 57,600 (alternatively RS232 or other connection protocols, such as USB are used instead). At this Baud rate the number of ports per net may be required to be limited in order not to lose any readings. The readers may be assigned to, for example, 8, 11, 12, and/or 13 ports for achieving a mean data throughput of 37 readings per second per net. Optionally, for the whole arena with 5 nets an average of 185 readings per second is obtained. Optionally or alternatively, the decoders may be clock synchronized in order to avoid beat frequency interference between the decoders and a power source due to close proximity of the antennas. This may be achieved by wiring one clock signal of one decoder to all the synchronization inputs of all the other decoders.

Exemplary 12 VDC Linear Power Supply

In some exemplary embodiments, power to the readers is provided by a DC linear power supply for preventing interference with the communicating frequency of the reader. For the above mentioned reader, a suitable power supply for use with the decoder is a +12 VDC linear power supply thereby preventing interference with the low frequency 128 KHz of the transceiver. Optionally, a suitable exemplary power supply is a type M 15-16 HE, manufactured by Delta Elektronika BV. The characteristics of the power supply include delivering up to 16 Amperes at 12 Volts DC with a voltage regulation of 0.02% @±10% Line variation and, 0.02% @ 0-100% load change. The ripple is 0.2 mVrms. Optionally, the decoders draw a peak current of ~200 ma at power up and ~70 ma continuous. Optionally, for 55 decoders at least 11 Amps at power up and 3.85 Amps, continuous, are required.

Exemplary Processor

In an exemplary embodiment, the processor includes a PC with a National Instruments NI PCIe-8431/8 RS485/RS422, 8-port asynchronous serial interface card. The PC acquires the data accumulated in the decoders at a Baud rate of 57600 and stores it on the hard disk. Optionally, the data acquisition rate may be lesser or greater. Additionally or alternatively, the acquired data may be stored in an external storage device such as, for example, an external hard disk, a flash memory connected to the PC, or other data storage device. Optionally, data is stored in a database. Optionally or alternatively, it is stored in log files.

In some embodiments, all acquired data (e.g., RFID and/or video) is stored. Alternatively, just the processing results are stored. Optionally or alternatively, at least data indicated by a user, e.g., using rules or other definition means, as interesting are stored.

In an exemplary embodiment of the invention, the processor includes one or more outputs for controlling actuators. These may also be provided on one or more electronic cards and/or share the same cards.

Figure 3A:
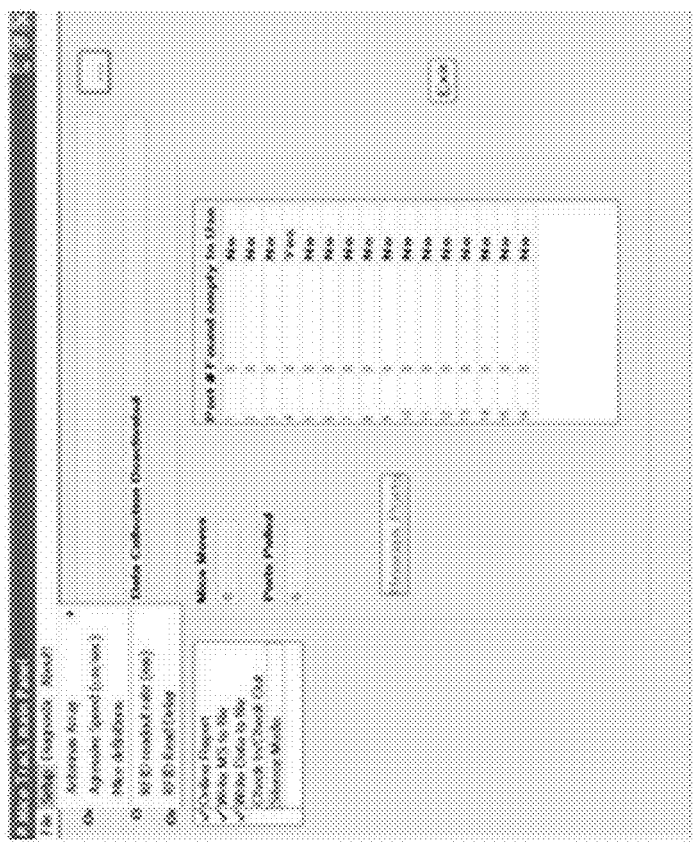
Figure 3A:
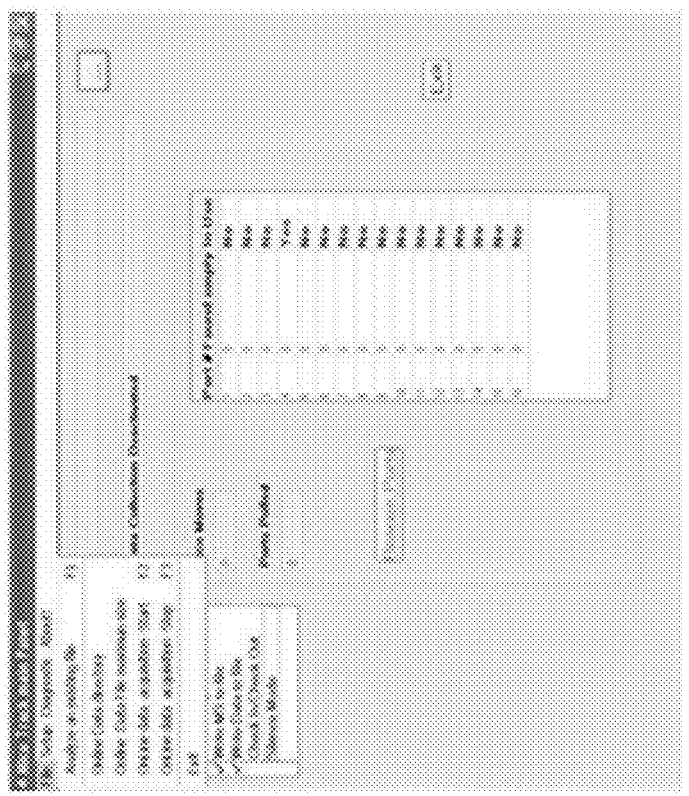
Figure 3B:
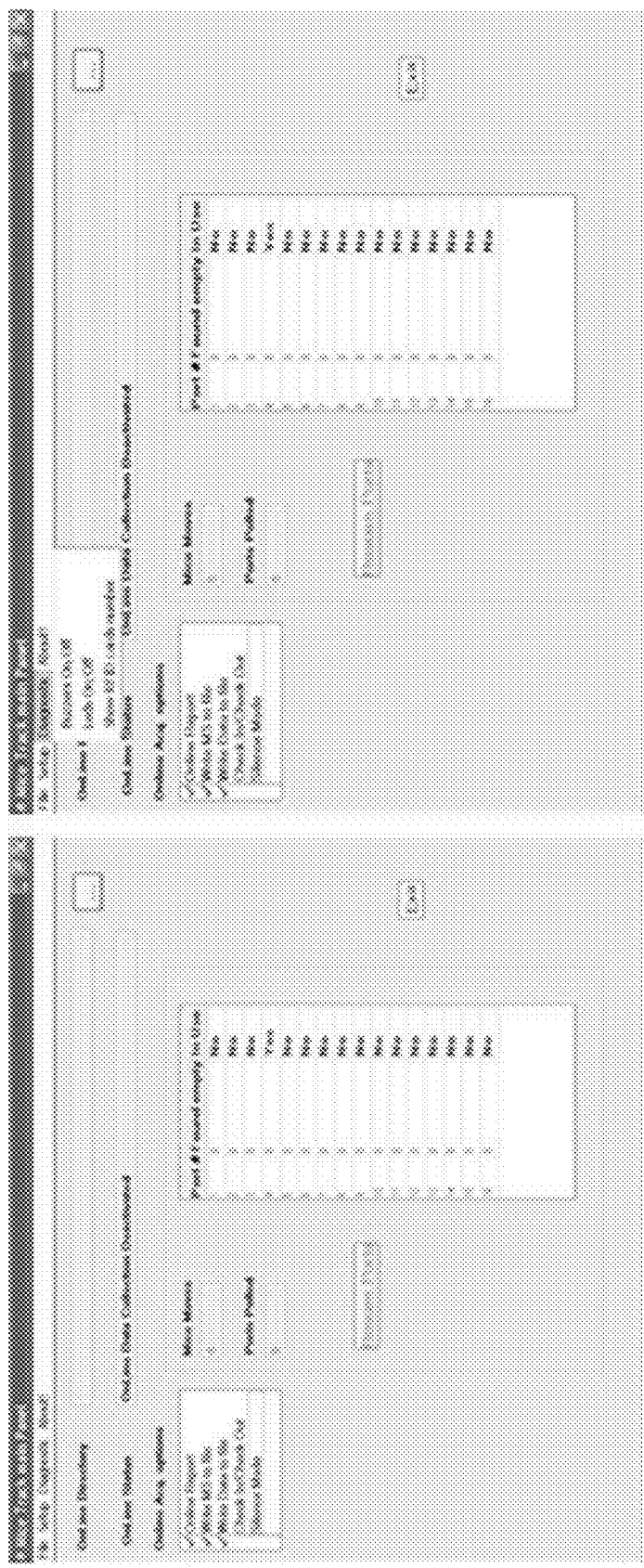

In an exemplary embodiment, software for controlling system 100 is written in Lab Windows/CV1 VER 10. The application polls data from the readers at a user predefined rate. FIGS. 3A and 3B schematically illustrate sample application screens displayed on the PC, including possible functions included in the application. Optionally, the software application includes software modules to perform the following steps:

a) at startup the software searches all the possible COM ports that maybe available for communication with the decoders and mark them on the GUI;

b) once the search is complete all the available ports appear on the GUI window along with their individual number and the amount of pollings for which there was no data in the particular port; and c) writing into a file in a particular library the data of each transponder each time it is detected by a reader.

In some exemplary embodiments, the data of each detected transponder ID is arranged as a string with the following format:

0006B7C3BD;21/09/2010;16:42:32.474;30 where,
0006B7C3BD is stand-in for an ID chip number;
21/09/2010 is a stand-in for a Date;
16:42:32.474 (hh:mm:ss.msc) is a stand in for a real time stamp including 3 digits for micro-sec; and
30 is a stand-in for the antenna number over which the ID was detected.

In some exemplary embodiments, any one, or any combination, of the following options are included in the software application (referring to FIGS. 3A and 3B):
a) Under "File" the options include:
  a1) "Analyze an existing file"—This option is for the analysis of collected data.
  a2) "Online data directory"—Allows the user to choose/open a data directory.
  a3) "Online data file maximum size"—Allows the user to set the maximum size of each data file.
  a4) "Online data acquisition-start"—Starts the data acquisition for an experiment.
  a5) "Online data acquisition-stop"—Stops data acquisition of experiment.
b) Under "Setup" the options are:
  b1) "Antennas array"—selects number of antenna to be operable in the array. For example, 9 antennas may be selected in the array for operation. Alternatively, 47 antennas may be selected in the array.
  b2) "aggressive speed (cm/sec)"—Allows the user to define the threshold above which the mice speed is considered to have an aggressive behavior.
  b3) "Mice definitions"—Define individual mouse properties (e.g., what to expect, rules and/or what information to collect and/or stimuli to apply.
  b4) "RFID readout rate (ms)"—Allows the user to define different reading rates in msec.
  b5) "RFID read delay"—Allows the user to choose the number of delays between each consecutive reading of the decoder data.
c) Under "Diagnostic" the options are:
  c1) "Buzzers on/off"—Allows the user to set the decoders buzzers on or off, the default is off.
  c2) "LEDs on/off"—Allows the user to set each decoder LEDs on or off, the default is on.
  c3) "Show RFID cards number"—displays for each RFID card its individual number.
d) On the GUI window there are additional options:
  d1) "Online report"—Allows opening a report window so that the collected data is visible online.
  d2) "Write ms to file"—Allows the addition of msec data to the time stamp, default is with msec.
  d3) "Write data to file"—Enables or disables the collected data to be written to a file.
  d4) "Check in/Check out"—This option allows for a Check-in/Check-out mode of data collection rather than continuous data collection.
  d5) "Silence mode"—This option prevents interruption of the data reading by the decoder during a read cycle.
  d6) "Mice moves" show the accumulated number of detections.
  d7) "Ports polled" show the total number of pollings that the system performed.

In an exemplary embodiment of the invention, not specifically shown, the software includes a scripting language interpreter (or a compiled language executor) and/or a rule (e.g., {pattern, pre-condition, action} type rules) definition interface for defining activities and/or triggers and/or responses to triggers and/or other logics. For example, a logic may be to apply illumination at 12 hour intervals and when detecting a chasing even during the time period 1 hour after "sun down", wait until the chasing animal is alone in a box, trap the animal and apply tests, such as weighting the animal and/or dosing it with medication, for example, via a specially delivered food pellet.

Exemplary Imaging System

In some exemplary embodiments, one or more imaging devices 103 are positioned in the enclosure for capturing real time images of the mice inside the arena. Optionally, the images are captured in darkness. The imaging devices may include a video imaging device, for example, a CMOS or CCD (charge coupled device) camera. Additionally or alternatively, the imaging devices include an IR imaging device and/or a thermal imager, ultrasound imaging device, or any other type of imaging device known in the art suitable for imaging the mice. The imaging devices may be mounted on the top section of the enclosure to allow video capturing of the arena. Optionally or alternatively, at least one camera is positioned at a side of the enclosure, side viewing. Optionally or alternatively, at least one camera is positioned inside area 101, for example, at a watering location. Optionally, one or more imaging devices are positioned and their field of view arranged to capture the nesting cages. Optionally or alternatively, one or more imaging devices has its position, orientation, zoom, focus and/or shutter size controllable, for example, to provide detailed images of a particular event. Optionally, a higher resolution camera (video and/or still) is provided for such use. Optionally or alternatively, different cameras and/or dedicated cameras are provided for different parts of system 100 and/or arena 101.

Optionally, at least some cameras include optics designed to correct for distortions due to the wide angle of view. Optionally or alternatively, such distortions are corrected by software. Optionally, a calibration procedure is run to line up arena features with locations on the acquired image and/or to align with RFID antenna. Optionally, one or more light sources, for example, LEDs are provided in a known position relative to the antennas, and illuminated in a known spatial and/or temporal pattern, to allow automatic calibration of camera to arena coordinates. Optionally or alternatively, such illumination is invisible to the animals and is performed while the animals are in the enclosure and/or to assist in tracking a field of view of a moving camera, as it moves.

In an exemplary embodiment of the invention, the images from multiple imagers are stitched together to provide a composite image. Optionally or alternatively, the images overlap.

In an exemplary embodiment of the invention, the system stores information (e.g., a table) matching up imagers and specific RFIDs that can be viewed by the imager.

In some exemplary embodiments, images acquired by the imaging devices are recorded and time synchronized with the RFID data acquired from the readers.

Optionally, the resolution of the time synchronization is less than 100 ms, 50 ms, 1 ms, 0.5 ms, 50 μs, for example, 40 μs, 25 μs, 15 μs, 10 μs, 7 μs, 5 μs, 3 μs, 1 μs, or less or intermediate resolutions.

Exemplary Video Recording System

In an exemplary embodiment, an array of low-light sensitive video cameras (commercial-type CCD camera, >570TLV black/white) is positioned above the arena and connected to a commercially available digital recording unit (DVR) that allows to record the video streaming from 16 channels simultaneously in mJPEG compressed format at 25-30 frames per second (FPS) on a PC computer. Optionally, an array of infra-red illuminators is used for allowing mouse behavior to be observed in the dark. Optionally, time synchronization is accomplished by establishing the DVR computer as the "Time server" (the time settings of the experiment) and all RFID computers are preconfigured as "Time clients" (the time settings are taken from the above Time server). Optionally, a Time Synchronization deployment used is based on the product <Absolute Time Server> developed by the FlexibleSoft company.

Exemplary Processing of RFID Tracking Data and Imaging Data

Figure 4:
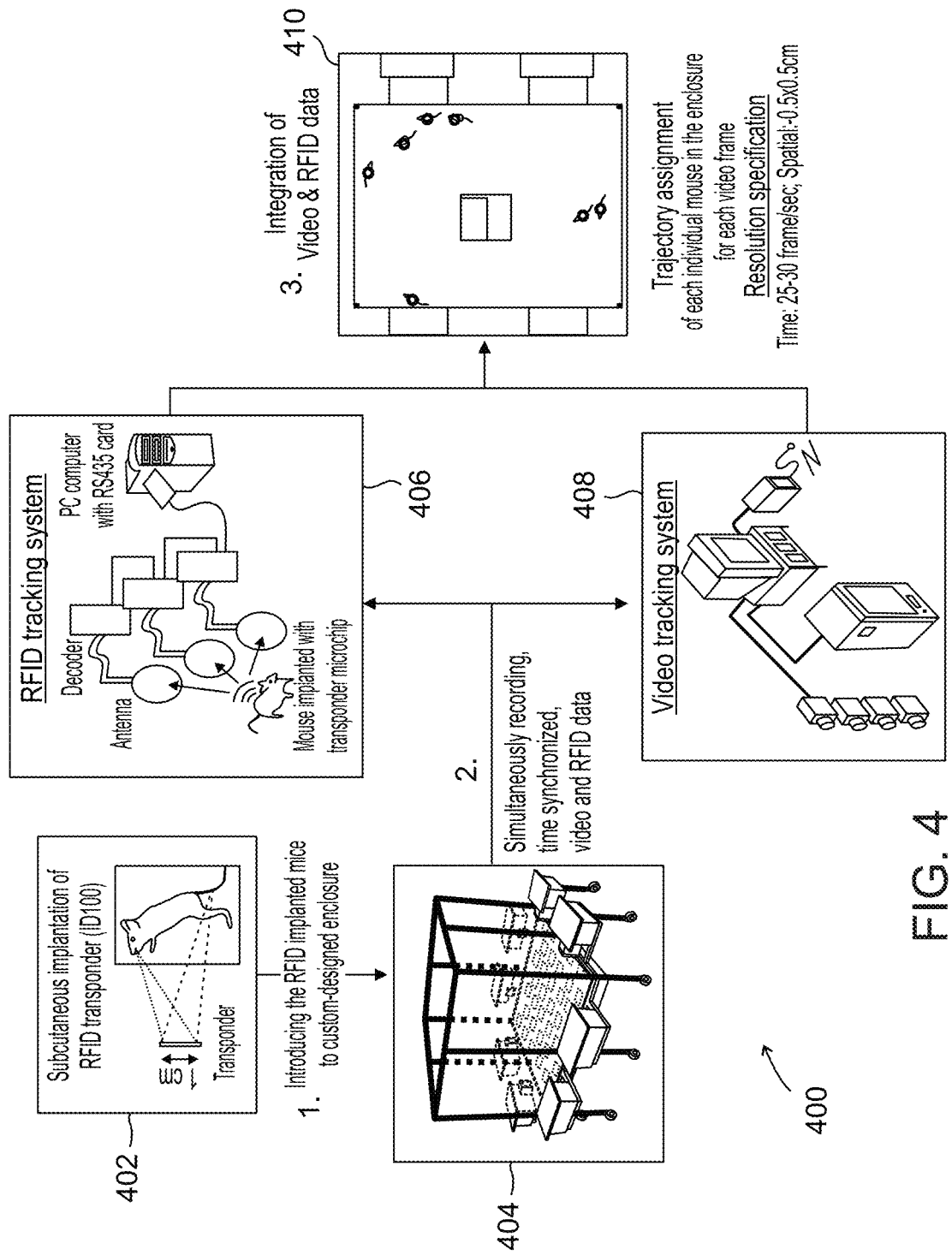

In some exemplary embodiments, the processor analyzes the RFID data and the synchronized imaging data and determines the trajectory of each mouse. This information is then optionally combined with and/or analyzed to extract information related to the behavior of the mice in the nesting cages for determining behavioral identification and classification. An exemplary flow chart of the method for determining the trajectory is shown with respect to FIGS. 4-6 (e.g., flow diagrams 400 and 600 and image 500). The order described below can be changed and/or acts omitted.

First, one or more transponders are subcutaneously or otherwise implanted in/on each mouse to be tracked. This is shown at 402.

Second, the mice are placed in the enclosure. This is shown at 404.

Third, time synchronized images are simultaneously recorded with RFID tracking data. This is shown at 406 and 408, which also schematically show an RFID tracking system and a video tracking system.

Figure 5:
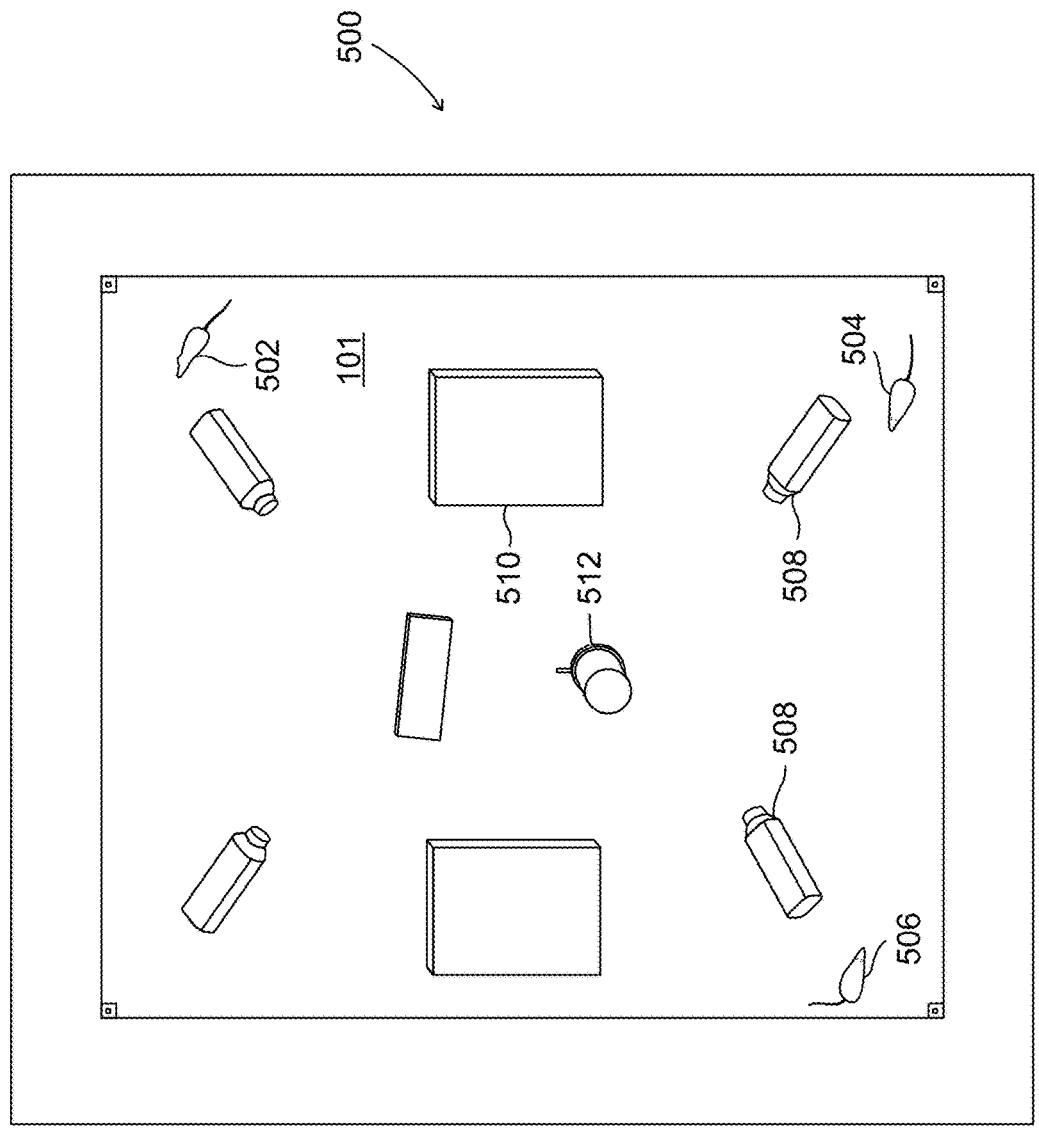
Figure 6:
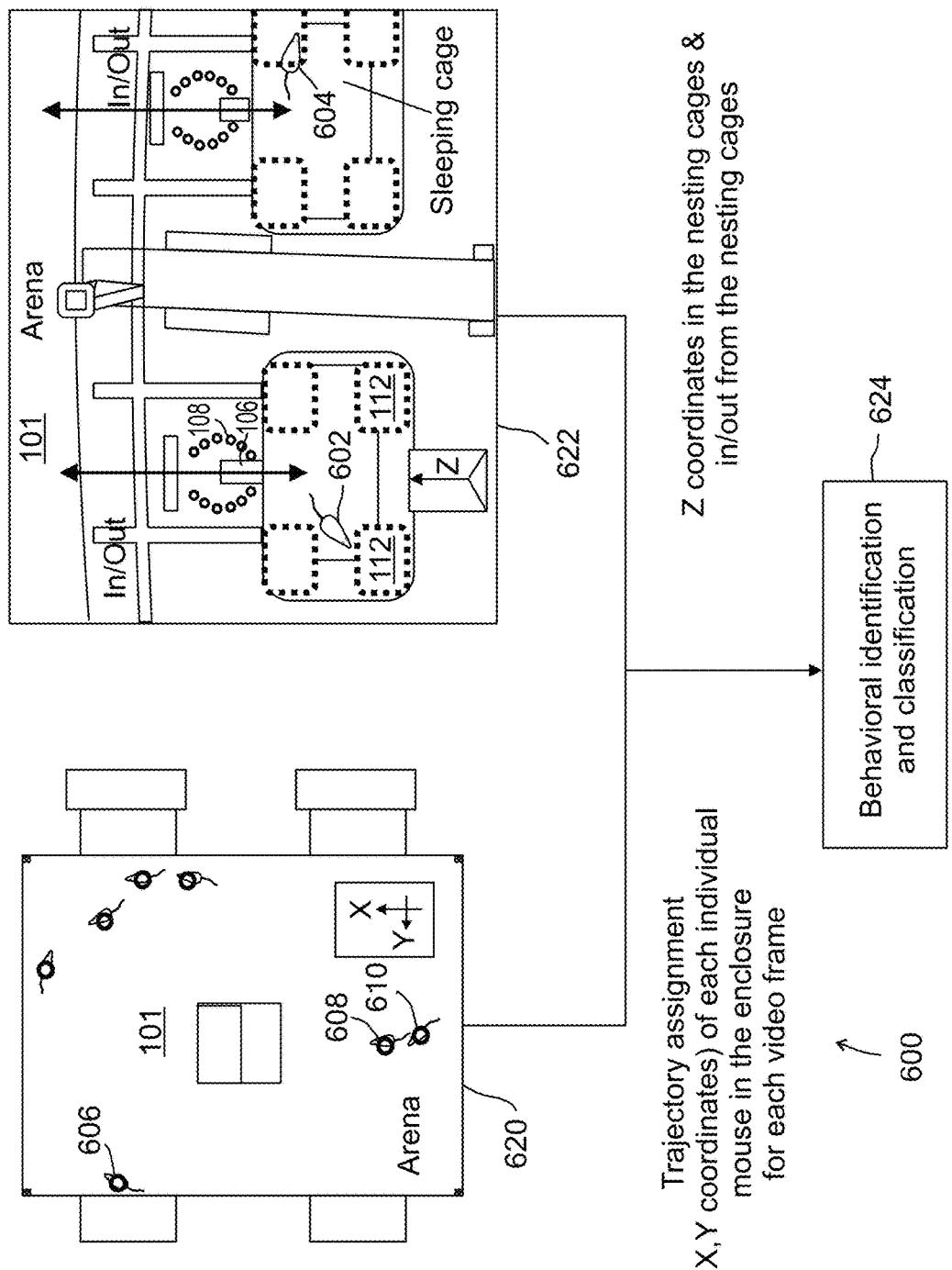

Then, (e.g., at 410) in every video frame (25-30 fps) the contour of each mouse in the arena is identified and/or its center of mass calculated. Optionally, body posture (e.g., position of front-rear sections of body and/or direction of a centerline) is determined for mice. Optionally, mice which are not imaged are not identified, for example, those hidden by objects in the enclosure (e.g., in a shelter box). Optionally or alternatively, they are identified, but the accuracy of their location and/or being distinguished is noted for downstream processing acts. Exemplary accuracies are between 0.1 and 3 cm, for example, 0.5 cm for position and time accuracy of between 0.01 and 1 seconds, for example, 0.04 seconds. Intermediate or larger of smaller accuracies may be provided as well. FIG. 5 shows a schematic of an image of arena 101, showing various objects 508, 510, 512 and identified mice 502, 504, 506, for example, whose contour is extracted from the image and optionally overlaid thereon and/or otherwise used for processing. This is also shown as mice 606, 608 and 610 in FIG. 6. Optionally, other moved objects are identified and reported to a user (e.g., using an alert generator or electronic communication, not shown).

Then, (e.g., at 620) a best mouse path is calculated by extrapolating detected mouse positions from previous frames and/or based on calculating the distance between predicted positions and actual positions.

Then mouse identification positions are optionally estimated using the RFID tracking data associated with every synchronized video frame and the mouse RFID identification is matched with a video estimated mouse path (620).

At 622, the trajectory assignment of each mouse is optionally matched up with Z-axis monitoring in the nesting cages and/or with movement into the cages and out of the cages. At 622 are shown, for example, mice 602 and 604, in cages 104, optionally as identified by a camera seen from above, but also as may be provided solely by RFID systems. It is noted that the matching up can also be over time, for example, behavior of a mouse in arena 101 at a first time may be matched up with its behavior in cage 104 at a later time. This may provide a time line of mouse activity.

At 624, a behavioral identification and/or classification is optionally generated for one or more of the mice, for example, as will be described below.

It should be noted that system 100 may be configured for other animals than mice and/or for mixed animal types (e.g., mixed ecologies and/or to study prey-predator relationships. For example, animals may include rodents, reptiles (e.g., lizards or turtles) and/or invertebrates. In some cases, RFID tags are attached to the animal, rather than implanted, for example, using a clip or adhesive.

When used for larger and/or slower animals, RFID accuracy and/or visual resolution are optionally reduced.

In an exemplary embodiment of the invention, a system as described herein is used for aquatic animals, for example, fish or invertebrates.

In an exemplary embodiment of the invention, RFID antennas and/or chips that can detect a chip in a larger vertical range (e.g., 5 cm, 10 cm, 20 cm, 40 cm or intermediate or greater distances), may be used.

In an exemplary embodiment of the invention, young, un-implanted animals, are detected based on size. Optionally, only statistical information for such animals is available, but not identification.

Detailed Example of a Data Fusion Method

Following is the description of one particular embodiment of a data fusion method for fusing position and identification information, for example, as provided by an RFID system with video frame data, in accordance with an exemplary embodiment of the invention. As described, this method calculates the positions and velocity of each mouse during in a time period, based on, as input, monochrome video and RFID data files. This can be done in real-time or offline, as desired and/or depending on the application and/or available processing and/or storage.

Figure 8:
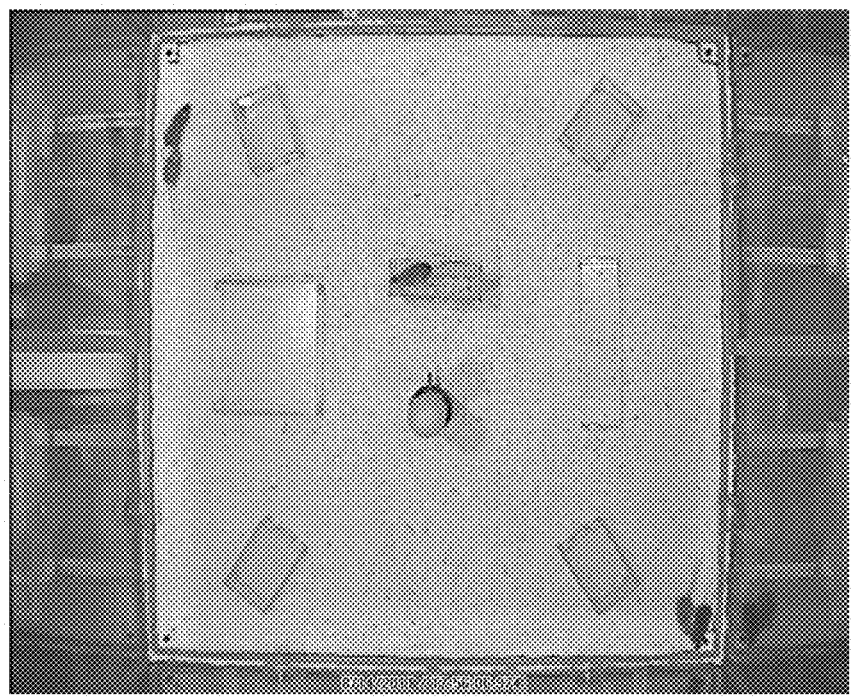

In this example, arena 101 is a stage with a size of 1.14×1.14 meters (e.g., an open field) with 6 or 8 side cages. As shown, the stage has two layers, a ground layer (arena 101) and a top layer for example in the side cages. FIG. 7 shows a numbering for RFID locations for this stage. FIG. 8 shows an image captured by a camera (e.g., 103) of this stage. Additional specific details of this example (and which also may be varied for other implementations) include:

(a) RFID readers provide data from antennas arranged in the stage, for example, as shown in FIG. 7. Typically, the probability of antenna detection depends on the distance, mouse velocity, number of chips in the mouse, and chip position and/or orientation in the mouse and/or rate of reading at each RFID antenna. Typically shorter distance between the chip and antenna increases the probability to mouse detection by antenna. In this example, Antenna Detection Length (ADL) is estimated as 200 mm.

Generally, a mouse that is not at ground level cannot be reliably detected by a ground based antenna. Other antenna and/or chip designs, for example, as known in the art of RFID systems can detect transponders at a greater distance from the antenna, also in a vertical direction, for example, 2 cm, 10 cm, 30 cm, 40 cm or greater or intermediate distances, and may so be used. In the instant implementation, stage antenna can detect mice only in the stage and antenna in side cages (cells) can detect only mice in such side cell as they are installed.

Also, immobile mice are often more difficult to detect. Optionally, the system assumes an undetected mouse did not move and verifies this in a video image. Optionally or alternatively, such an assumption is also based on a quality of a last detected RFID signal from the mouse. Optionally or alternatively, the system includes a "stimulation" setting, where mice are encouraged to move (e.g., by sound or electric shock) so as to perform an inventory of such mice.

Fast moving animals may be difficult to detect. Optionally, antenna where a fast moving mouse is expected (e.g., based on previous behavior and/or video capture and/or based on a difficulty in analyzing video imagery, are scanned more often and/or with more sensitivity, to detect such mice. Optionally, a special RFID interrogation and/or higher resolutions imaging and/or better zoom and/or other sensor data is acquired at and/or of locations where there is suspicion of a mouse which is not detected.

In some embodiments of the invention, a central signal is sent to all RFID transponders and a received signal is received at local antennas.

Additionally it is noted that increasing the number of chips in a mouse and/or placing such chips in legs, rather than in body, or in bottom of body rather than at top, may increase detection probability of a mouse in which they are implanted.

(b) Video. Optionally, the video is monochrome video 704×576@30 FPS with Frame sampling rate which may be lower, for example, ~13 FPS, due to non-uniform sampling rates. As noted the data may be provided and/or processed on-line, for example, within 30 seconds, 10 seconds, 1 second, 0.5 seconds, 0.1 seconds and/or faster, or may be processed offline. Optionally, dedicated hardware for image processing is provided, for example, a DSP.

(c) Clock. Optionally, there are two clocks in the system, one being a clock in the video frame grabber and one in the RFID system. Optionally, one serves as a master and another as a slave or a shared clock source is used.

In an exemplary embodiment of the invention, the described method detects mice positions in the stage, calculates an estimates position of the mice using the RFID system and analyzes each mouse positions.

In one method of determining the mouse position from the video image, the following are carried out. First the background is subtracted. The background is optionally learned. In an exemplary embodiment of the invention, a problem that is overcome is that it is difficult, using difference methods, to detect sleeping mice and it is difficult to select when to acquire a reference image because the time when mice are sleeping (or awake) cannot generally be reliably predicted. Optionally, however, it is desirable to provide an up-to-date background image, for example, to allow objects in the arena to be moved and/or allow the animals to change the image of the arena. While Foreground Object Detection and Codebook implementation could be used instead, in an exemplary embodiment of the invention, the background is learned based on mask, minimum and maximum images.

Figure 9:
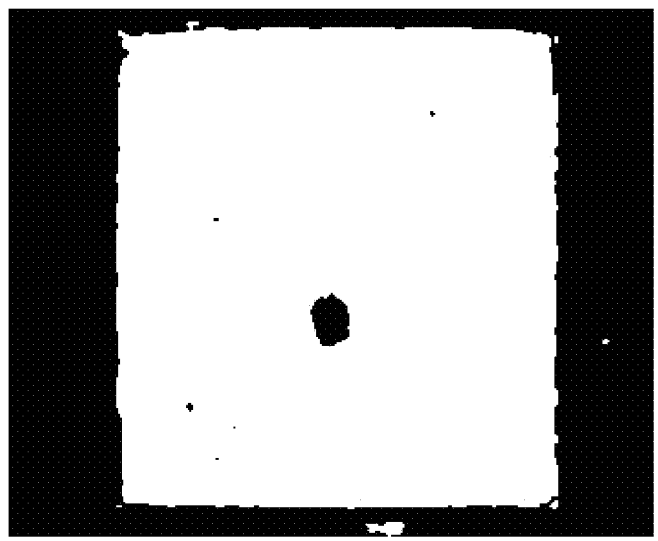

FIG. 9 is a mask image, showing pixels that do not change over a learning period (e.g., 1-50 minutes, 1-2 hours or other time scales). Optionally, the number of images used is for example, 5, 10, 100, 1000 or an intermediate or larger number. Not all images need have a same weight. Optionally, images that adversely affect a detection probability are dropped or assigned a lesser weight. For example, reconstruction can be tried with various subsets of images, to select a best subset to be used. Optionally, the learning is a sliding window learning, with an overlap between images used to learn a first background image and later background image. Optionally, learning (e.g., FIG. 9) is binned according to illumination conditions.

Figure 10:
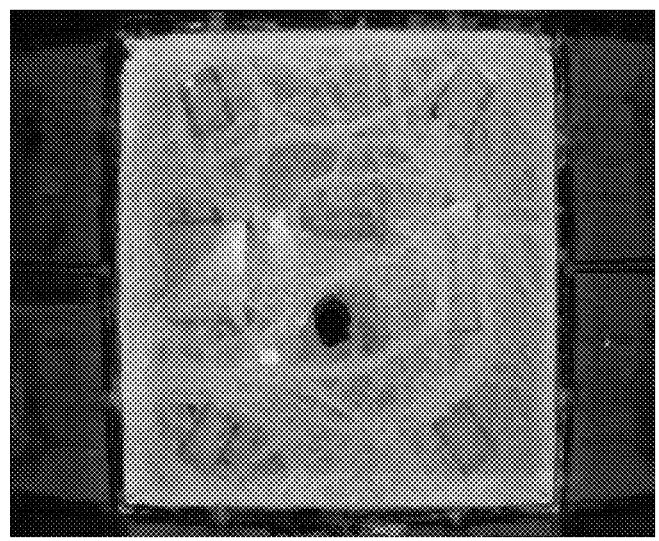

FIG. 10 is a maximum image showing the maximum value for each pixel over a series of images.

FIG. 11 is a minimum image showing the minimum value for each pixel over a series of images. As can be appreciated, maximum and/or minimum need not be absolute. For example, a threshold may be used for one or both. Optionally or alternatively, a function, such as a histogram is used to define minimum and maximum and/or to apply a correction to at least some of the selected and/or compared pixels.

Then background is removed from the instant image (e.g., FIG. 13 or an average of several images and/or a different composite image). The result is shown in FIG. 12, in which outlines of mice can be seen, along with some noise pixels. Most of the background is removed, however. Optionally, multi-source and/or diffuse illumination is used, for example, to reduce shadows.

The pixels in Image 14 are optionally clustered, to generate clusters, each one representing a mouse. Optionally, RFID data is used to decide if a cluster should be formed and/or where its center should be (e.g., should a collection of pixels which might be noise be considered a cluster). Optionally or alternatively, size is used as a consideration. For example, very small clusters may be ignored. Optionally or alternatively, sparse clusters (e.g., less than for example, 75% or 50% fill, optionally of an ellipsoid shape) are ignored. Optionally or alternatively, clusters with un-mouse-like shapes (e.g., not generally ellipsoid like) are ignored.

In an exemplary embodiment of the invention, clusters are filled in using a template of a mouse shape, once detected.

In an exemplary embodiment of the invention, if a cluster size is too large, there is an attempt to split it, for example, into two or three, optionally using the number of IDS (optionally +−1) from the RFID system at that location. Optionally, for example, as shown in FIG. 16, if a cluster size is too large, a k-means clustering method (for example) is applied to separate classify a cluster of mice pixels into two mice (FIG. 15). Optionally, the profile of the cluster is analyzed to detect possible overlap areas of two mice, for example, a narrowing, as shown.

In general, the center mass of each cluster sign us mouse position. Optionally, for each frame a set of mice positions $\{X_n^f\}$ is generated, where f is the frame number and n is the position index.

A method which may be applied on such data is calculation of a pass probability, which estimates the probability of passing of a mouse from a point m in a frame index f to a point n in a frame f+1. In general, the probability may be represented as $$p = \frac{U}{N},$$

where N is the number of pixel on a connecting point $X_m^f$, in frame f to point $X_n^{f+1}$ at frame f+1. This line may have a length adapted to match the landscape such a mouse might traverse (e.g., be "longer" for water" and intermediate length for difficult to traverse terrain). U is the sum of pixels on the line in a union frame (e.g., FIG. 17). In general, the upper case letters are positions in frame f−1 and the lower case letters indicate positions estimated for the instant frame.

The following table shows that for most mice there is a high pass probability, by mouse B, due to its larger movement amount, has a low value. When processing all the mouse data, mouse B will be correctly identified, for example, using RFID information and/or based on it being the most likely match.

| Pass value | a | b | c | d |
|---|---|---|---|---|
| A | 1 | 0.23 | 0.1 | 0.1 |
| B | 0.23 | 0.64 | 0.26 | 0.05 |
| C | 0.1 | 0.3 | 1 | 0.1 |
| D | 0.05 | 0.06 | 0.1 | 1 |

RFID information is optionally processed using the following method.

An average mouse position can be calculated using all detecting RFIDS and/or detections over a period of time, for example, $$X(t) = \sum X_{RFID}(t) e^{-\frac{\Delta t^2}{\sigma^2}},$$

where $\Delta t = (t_{RFID} - t)$

In an exemplary embodiment of the invention, the position closest to detection time (in the video) will be assigned a highest weight. Useful processing may require sufficient data collected from the mouse. If, for example, data is only available 0.5 seconds before video acquisition, reliability of position may be low.

In an exemplary embodiment of the invention, a mask area of the mouse position provided by RFID is calculated.

$$M(t) = \max\left(\frac{\Delta t + 0.03}{0.06666} S \times 180\right) < |x(t) - X_{RFID}|,$$

where $\Delta t$ is the time difference from mouse detection by RFID antenna to frame acquisition, S is the maximum mouse speed (e.g., ~400 mm/frame), x(t) is the point position of a mouse detection in a video frame f (t), by video processing and $X_{RFID}$ is a last read antenna position of the mouse. As can be seen, for example, after 200 ms from a last read a mouse can be substantially anywhere in the arena or at least in a relatively large portion thereof.

In an exemplary embodiment of the invention, one or more of the following assumptions are made to assist in processing and assigning positions to mice. First, it is assumed that the strongest RFID signal (e.g., power and/or number of reads in a time period, such as one second or less) comes from an antenna closest to true mouse position. For example, if an antenna has multiple reads, the mouse with most reads is assumed to reside at that antenna. Other mice may be "added" to that antenna, for example, if no other location for them is identified and the video image processing so indicates. Another assumption is that a mouse that was not detected to exit a location (e.g., a cage 104 or an RFID mask area location), remains in that location. As with other assumptions, if mouse detection fails, one or more assumptions may be relaxed, to see if this assists in assigning mouse positions. It is to be noted that as much data is collected a small number of erroneous mouse identifications need not be an issue. Optionally or alternatively, once a correct mouse assignment is made, previous detections may be corrected and behavioral parameters updated accordingly. Also assumed may be a mouse maximal speed (e.g., 35 MPH which comes out to be about ~400 mm per frame, for ~13 fps). Optionally, frame rate is increased if fast or faster animals are used. Another assumption is that an error between RFID clock and video clock is less than 100 MS. Desirably, the error is smaller, for example, as noted above. Another assumption which may be made is that if there is no RFID detection for long time of a mouse then probably the mouse is immobile.

In operation, based on the above assumptions, mice are tagged with video positions in the video image.

An optional next act (which may be performed, for example, simultaneously and/or iteratively with tagging, for one or more mice), is determining a trajectory.

In an exemplary embodiment of the invention, a trajectory between tag positions, the following method may be used (e.g., the video trajectory can be used to improve the pure RFID trajectory, by one or both of smoothing and/or filling in for missing temporal and/or spatial data).

In one method, the square of the total step size from a first RFID mouse position to a subsequent RFID mouse position in a subsequent frame is determined. Each video frame adds m×n trajectories, with m being the size of the current frame positions set, and n being the previous frame positions set. Formally, $$D^2_{m,n} = \sum_{f\,first\,anchor}^{current\,frame} \frac{|X_m^f - X_n^{f-1}|^2}{\sigma'^f_{m,n} M(X_m^f)(|X_m^f - X_n^{f-1}| < MS)},$$

where
$X_m^f$ is the position detected in video, in the first and next anchor frame we have single position of anchor tag position X0,
σ (f, m, n) is the pass Value from $X_{ml}$ to $X_{l-1m}$, $$M(X_l) = \begin{cases} 1, & in \\ 0, & out \end{cases}$$

is the mask value of position $X_l$ for a current mouse, and MS is the maximum mouse step size.

Then, for each position m, the minimum total step size squares, is selected. If $D_{m,n}^2$ too high (e.g., above an absolute or relative threshold) calculation of the trajectory is stopped. It is noted that a reliability of calculation of a trajectory may be provided for downstream processing.

For a next anchor frame the minimum $D_m^2$ is selected as a mouse trajectory. The squaring is optionally used to provide a higher score for uniform steps.

Optionally, if there is a missing previous mouse position of one type (e.g., video or RFID in the first frame or in the next frame, a minimum step size in the frame is selected (e.g., an undetected mouse in a modality is assumed, as an initial estimate not to have moved).

In some cases, no RFID signal is provided because a mouse is, for some reason in a vertical position above the range of the RFID.

In some cases, a mouse is not found because it is in a no-view zone.

In some cases, for example, if a mouse has not been read for several frames, too many trajectories are possible. This may happen if the mouse is running very fast. Optionally, first the easy to detect mice are found and then the hard to detect mice are assigned positions, for example, based on only on video image data and/or on historical data.

Other methods of matching up positions between frames to estimate trajectories may be used, for example using various score functions, various search methods and/or other matching methods.

Parameter Extraction

The above has described the extraction of particular parameters, trajectory and positions from the data. Some aspects of the invention relate to the extraction of other data. Optionally, such extraction is applied on data provided using other means and methods than described herein, for example, via laborious manual tracking and data entry. Also, while the examples relate to mice, the methods described therein may also be applied to other animals, such as rats, or for example, as described herein. A computer is optionally programmed and/or provided with software on a computer readable media, to provide such processing. Optionally, the processing is provided by a remote or local server connected over a network.

In some embodiments, one or more parameters are considered qualitatively, e.g., as being above or below a threshold and/or conforming to a pattern. Optionally or alternatively, one or more parameters are considered quantitatively (e.g., a number of chasing events, position in a hierarchy, etc).

In an exemplary embodiment of the invention, data extraction may be classified as follows:

(a) information about a single animal, for example, position, speed, posture;

(b) information about several animals, for example, distance between animals, chasing behavior;

(c) information dependent on history, for example, exploratory behavior;

(d) information based on (e.g., a function of) several parameters, for example, a parameter defined, as the ratio between sleep and running activities;

(e) information based on several animals and history, for example, social hierarchy; and (f) classification information, for example a vector of values for any of (a)-(e) which can be used to identify an animal as belonging to one classification or another and/or to track changes in its aggregate behavior over time.

Any and/or all of such information may be extracted from the collected data, for example, as described below and above. As can be appreciated, a mouse may be associated with more than one parameter (e.g., 2, 3, 4 or more) for a given time, for example, a mouse may have a social hierarchy level and be eating and avoided by other mice and have a behavior typical of, for example, a certain phenotype, all at the same time.

Examples of Behavioral Parameter Extraction (e.g., of Types (a)-(c))

In an exemplary embodiment of the invention, basic locomotion and/or social interaction behavior are extracted for each mouse, for example, from image data, from position data and/or from tracked trajectories data. The locomotion behavior may be identified as one or more of the following for each time frame.

(1) in sleeping box—mouse position is in sleeping box outside the open enclosure;

(2) stop—mouse is not moving (e.g., more than a threshold amount) in the open enclosure;

(3) walking—the mouse is moving in the arena with a velocity beneath a threshold value, for example, 30 cm/s;

(4) running—the mouse is moving in the arena with velocity above, for example, 30 cm/s;

(5) in shelter—the mouse position is in a shelter inside the open enclosure. Other structures may also be so identified.

(6) exploratory behavior—the mouse is moving slowly and shows a historical pattern of motion consistent with exploration. Optionally, sniffing behavior is identified on the video frames, by identifying the mouse head and analyzing movement of the head of the mouse.

(7) quality of locomotion, for example, a level of weaving, may be identified by a trajectory. Optionally or alternatively, limping may be identified by image analysis.

(8) maximal running ability—fastest speed over a time period, such as 10 minutes, an hour, a day or greater or intermediate time periods, may be identified.

In an exemplary embodiment of the invention, mouse position in the sleeping box is determined using readings from RFID antennas that are positioned on each box and/or on passageways thereto.

In an exemplary embodiment of the invention, shelter boxes positions are marked manually to the system so that a position in the shelter indicates sheltering behavior. Optionally or alternatively, a shelter has a dedicated RFID reader and/or antenna, so occupancy thereof can be determined independent of its physical position.

In an exemplary embodiment of the invention, mouse velocity is acquired by dividing the distance passed by mouse between consecutive frames, by the time between two such frames. Optionally, velocity (and/or other parameters as measured herein) is smoothed, for example, using Gaussian filter of 1 s width and/or extreme data values dropped and/or other filtering methods, for example, such as known in the art, applied.

In an exemplary embodiment of the invention, one or more of the following social behaviors are extracted and/or analyzed:

(1) chasing—a mouse is following one of the other mice in the enclosure;

(2) being chased—a mouse is being followed by one of the other mice in the enclosure;

(3) avoidance—a mouse runs away (and/or just not getting too close to) from one of the other mice in the enclosure;

(4) being avoided—one or more other mice do not approach this mouse. For example, this mouse runs away from one of the other mice in the enclosure and is not followed by this other mouse.

(5) specific avoidance—a particular mouse has a reduced interaction with a specific other mouse.

(6) coupling, nursing, grooming and/or fighting (optionally distinguished by the sex of the mice involved, duration of activity and/or velocity before and/or after, or possibly by manual indication)—two mice share a same position for a time above a threshold.

(7) Communal sleeping—multiple mice share a same location for a time over a threshold and amount of movement below a threshold.

(8) sociability level—is optionally measured as a function of time when a mouse is within a threshold distance of a threshold number of other mice.

(9) group coordination is optionally measured by similarity between activity of a mouse and additional mice.

Some examples of historical behavior (in addition to the above exploratory behavior and for example, food and water consumption patterns), which may be provided, include:

(1) Circadian rhythm, which may be detected, for example, based on one or more of sleep pattern, length of sleep periods, correlation between sleep and light conditions and/or regularity of sleep patterns.

(2) anxiety-like behaviors, which may be detected by, for example, absence of exploratory behavior and/or their length and/or relative time spent in hiding and in open field.

(3) stereotypic behaviors, which may be detected, for example, by identifying a same path repeatedly taken by mouse in a short time period, for example, with thresholds for the time period and/or for the number of repetitions and/or for degree of correlation between paths. Optionally or alternatively, repetitions behavior is identified by analyzing video frames and identifying repetitious movements. Optionally, tics may be identified from such video analysis.

(4) collision avoidance with objects, can be defined, for example, by average distance, as extracted from video frame between animal and an object and/or number of collisions with objects as a function of, for example, time and/or amount of movement.

(5) changes in behavior over time from introduction and/or in response to an event, optionally changes in various behavioral parameters from introduction are monitored until a steady state is achieved. Optionally or alternatively, various events, such as introduction of females to an all male enclosure, are used to generate changes in various behavioral parameters, such as described herein.

Following is an exemplary method of identifying chasing behavior. In an exemplary embodiment of the invention, chasing behavior is tested for each pair of mice. First, the time frame of the experiment is partitioned into segments that are assumed to include at most one chasing event, e.g., based on the distance between each tested pair of mice. This is based on an assumption that during a chasing event mice are relatively close and before and after chasing they are relatively distant from each other. Other assumptions, such as that they reach a minimal threshold distance, that chasing should end with hiding and/or that chasing can start when mice are near, are also possible. Optionally, only the segments where the distance between mice is below a threshold distance, for example, below 40 cm are analyzed for chasing events.

An additional assumption which is optionally made is that during a chasing event both mice are moving in the arena, therefore only the segments where a traveled path per mouse is above a threshold, for example, 60 cm and/or the velocity was above another threshold, for example, 1 cm/s are analyzed further.

A further condition for identifying chasing behavior is optionally a high trajectory correlation between two mice. Optionally, only segments with a correlation above, for example, 0.7 are identified as positive for chasing.

In an exemplary embodiment of the invention, the chasing mouse of a mouse pair, mouse1 and mouse2, is identified according to a direction of $\vec{v}_1$ the unit vector between mouse1 position $(x1_{t-1}, y1_{t-1})$ at frame t−1 and $(x1_t, y1_t)$ at frame t to $\vec{v}_2$, the vector between mouse2 $(x2_t, y2_t)$ and mouse1 $(x1_t, y1_t)$ positions. If vectors $\vec{v}_1$ and $\vec{v}_2$ point in the same direction then mouse2 is chasing mouse1, otherwise mouse1 is chasing mouse2.

Following is an example of identifying avoidance behavior. Optionally, avoidance behavior is tested for each pair of mice. Similarly to the detection of chasing behavior it is optionally assumed that during avoidance behavior two mice are close enough (e.g., distance between mice is below a threshold, for example, 50 cm, for entire segment and there are at least several frames with a distance below a lower threshold, for example, 25 cm) compared to the situations before and/or after the event. It is further expected that an avoiding mouse has high acceleration (above a threshold of, for example, 120 cm/s2 for at least several frames) during an escape phase and that the other mouse is also not static during the event. Other behaviors can also be defined as multiple phase patterns.

In an exemplary embodiment of the invention, an avoiding mouse (of a pair of mouse1, mouse2) is identified according to a direction of $\vec{v}_1$ a unit vector between mouse1 position $(x1_{t-1}, y1_{t-1})$ at frame t−1 and $(x1_t, y1_t)$ at frame t to $\vec{v}_2$ a unit vector between mouse2 $(x2_t, y2_t)$ and mouse1 $(x1_t, y1_t)$ positions during an escape phase, e.g., optionally similarly to identification of chasing behavior.

Examples of Behavioral Parameter Extraction (e.g., of Types (d)-(f)

More complex behavioral patterns may be extracted as well, in accordance with some embodiments of the invention.

In one example, behavior sequences (e.g., 1, 2, 3, 4, or more behaviors or acts in sequence, optionally with a small number of intervening behaviors and/or action sequences, including reflex and/or inborn "action sequences") can be detected as well, for example, "exploratory behavior, followed by chasing, followed by rest". Such sequences may also be defined by time frames between behaviors and/or durations of behaviors. Optionally or alternatively, statistical patterns, such as the mix of time in each type of behavior and/or coupling between consecutive behaviors, may be analyzed as well.

Another example of complex pattern is a hierarchy tree which is optionally constructed from chasing behavior data, for example, as described above.

In an exemplary embodiment of the invention, a hierarchy tree is built using the above chasing/being chased pairwise interaction data. Optionally, the data is specifically collected on a day where in an enclosure with only male mice, female mice are introduced. Optionally, first the dominance, equality or an undetermined relation is set for each pair of mice. Optionally, this is decided based on the number of wins (chasing events) compared to total number of chasing/being chased interactions. If below a threshold, then it may be assumed that insufficient data is available.

In an exemplary embodiment of the invention, the experimental result is tested using a binomial probability model, where dominance was determined if $$\frac{cdf_{0.7}^{1}}{cdf_{0.4}^{0.6}} > 2,$$

where $cdf_{p_1}^{p_2} = (n-k)\binom{n}{k}\int_{p_1}^{p_2} t^{n-k-1}(1-t)^k dt$ (binomial cumulative density function, n being number of wins and k being total number of interactions) and equality was set if $$\frac{cdf_{0.4}^{0.6}}{cdf_{0.7}^{1}} > 2,$$

and otherwise the result was considered unknown. Then a tree may be built, for example, a basic B-tree building algorithm may be used to build a tree using the dominance relation for each pair of mice.

Another type of parameter which may be measured is group parameters. For example, the cohesion of a group may be measured, for example, as a function of the total geographical spread of the group, average distance between pairs of mice, total number of social interactions per group (e.g., normalized for time period and/or mouse number) and/or probability of all members in the group exploring a same object.

In an exemplary embodiment of the invention, the various behavioral parameters are analyzed to classify mice to a phenotype and/or to determine an effect of an intervention on the mice. In an exemplary embodiment of the invention, a plurality of behavioral parameters are measured and then a machine learning method and/or clustering method and/or principal component analysis method or other methods, such as statistical methods known in the art, are used to identify behaviors which correlate and/or predict certain phenotypes and/or effects of interventions. In an exemplary embodiment of the invention, such analysis takes into account the following behaviors: sleeping, stopping, walking, running, hiding, chasing, being chased, avoiding and being avoided. Other parameters, for example selected form the parameters described above may be processed, for example, 3, 4, 6, 8, 10, 11, 13 or smaller or intermediate or greater number of parameters, for examples selected from the lists above, optionally with one or more additional parameters, may be processed for mouse phenotyping. In an exemplary embodiment of the invention, the system automatically applies various classification methods of data to identify parameters which can be used to classify a useful phenotype. Optionally or alternatively, various classification methods may be used to predict mouse phenotype. Optionally, experimental conditions, for instance introduction of new male or female mouse into the enclosure, and then automatically collection of parameter values by the system is used for classification. Optionally, a user inputs which animals and/or events (e.g., the 2 hours following medication) are to be distinguished from other animals and events and the system searches for parameters and/or combinations thereof that so distinguish and/or classifies individuals or groups based on the parameter values. Alternatively a manual process is used. Optionally, the result of such a process is a mathematical model that distinguishes (e.g., with a given probability) between mice and/or which correctly classifies mice at a given probability to a correct group. In an exemplary embodiment of the invention, a confusion matrix is built which shows the accuracy of classification according to correct and incorrect classification for each class.

In an exemplary embodiment of the invention, it may be useful to identify one or more of the following phenotypes: wild type, autism, schizophrenia, Alzheimer, Parkinson's and stress. These may be identified, for example, based on one or more of the behavioral parameters described above and/or below.

In one example, metabolic diseases are identified, at least in part based on time spent on an RFID antenna adjacent and/or attached to a food and/or water dispenser.

In another example, motor diseases are identified based on one or more of length of distance traveled, acceleration, angular acceleration, pattern of trajectory and/or frequency of pauses during a trip. Any and/or all of these can be extracted by, for example, known method of image and data processing from the trajectory data and/or acquired images.

In another example, damage to circadian rhythms and/or sleep disorders are identified based on amount of activity at night, vs. at day and time in sleep cages and/or in center of arena. Optionally, the values for a single animal are compared to values of the group. Other parameter values, for example, for other purposes, may also be defined as being relative to some function of group vale, such as average or other statistic.

Screening of effects of drugs and pharmacological manipulations and/or toxicological effects may be based on a learning system which automatically detects patterns and differences in behaviors between animals treated and animals untreated (or differently treated), for example, as described above.

Identifying social problems/diseases may be based, for example, patterns of movement and/or time spent chasing and/or being chased, amount and/or percentage of time near another animal, average distance from other animals, number of approaches and/or moves away from other animals, time in sleep cages and/or hiding alone and/or with other animals. Optionally, reaction to introduction of a stranger, may be used as an indicator for social problems (e.g., amount of interaction, distance and/or interest in a stranger.

Sexual and/or reproductive disorders are optionally detected based on interaction time between male and female, number of partners, average distance, time spent chasing and/or time spent being near (e.g., based on a threshold).

Additional measures which may also be provided by system 100, include, evaluating approach-avoidance conflict behaviors, including the elevated plus maze, light-dark exploration, open field exploration [1-6].

Also may be provided are detection of memory deficits in Alzheimer's models include using learning and memory tests, including spatial navigation tasks such as the Morris water maze, Barnes maze, radial maze, and T-maze; emotional memory tasks such as contextual and cued fear conditioning; and aversive tasks such as active and passive avoidance [7-10]. It should be noted that such experiments may be activated, for example, at a desired time and/or in response to identification of animal condition and/or behavior. Also, such experiments may be activated continuously and data collected and stored for specific animals as they take part in such experiments. Parkinson's and Huntington's disease models include use of sensitive motor tasks such as balance beam walking, walking and footprint pattern (e.g. cat walk system, Noldus) [8, 11-14]. Any and/or all of these may be provided by system 100, for example, using video capture and analysis to assess animal results of the task. Optionally, food is offered at the end of the task, for example, if image processing indicates that task was performed correctly and/or completely. Rodents' tasks sensitive to antidepressant drugs and which may be provided include forced swim (e.g., system 100 includes a retracting bridge and animal is dropped off bridge by movement of bridge, when animal to be tested is detected on bridge, swimming activity may be analyzed, for example, by video processing), tail suspension, and stressor-induced anhedonia [2, 15-17], both of which may also be identified using video processing by system 100 and/or data collection for manual processing of data.

In an exemplary embodiment of the invention, system 100 maybe used in various ways. One use is offline. The system collected data and optionally processes it to identifying potential interesting activities for user analysis. Optionally or alternatively, a user may indicate to system what types of events are interesting. Optionally or alternatively, the system may provide predefined behavioral parameter values. Optionally or alternatively, the system may search for parameters which are most distinguishing and/or provide suggested classification set of parameters, optionally with automatically generated weights. Optionally, RFID patterns (e.g., time, place, ID) are used as triggers for data collection.

Optionally or alternatively, the system is used online. Optionally, some or all of the above processing is done in real-time or quickly, for example within a few seconds or minutes of events occurring.

Another use is automated logic, where the system applies logic on real-time processed results, to generate new events and/or data collection. For example, system 100 may react to animal behavior and/or location and/or other triggers by, for example, applying an electric shock, sounding a noise, applying a puff of air, providing food, and/or trapping an animal or other actions. Optionally, such activities and/or further experiments are contingent of previous activities, for example, a time taken to traverse a maze may decide if the animal is sent to another maze, drugged and/or released, optionally automatically.

Another use is a user indicating an animal or animals of interest and/or interaction types and receiving updates and/or reports regarding that animal or animals (or interaction types).

General

It is expected that during the life of a patent maturing from this application many relevant image processing methods and data clustering and extracting methods will be developed and the scope of these terms is intended to include all such new technologies a priori.

As used herein the term "about" refers to ±10%, and may be applied to any of the values described herein, in some embodiments of the invention.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with a specific embodiment thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method for identifying and classifying complex social behaviors among a group of model organisms, comprising:
    automatically tracking the momentary location and identification of one or more model organisms in a group of 3 or more organisms living in an enclosure comprising a large environment with an area matching a natural habitat size for said group over a period of time to provide data,
    wherein said tracking includes the use of radio frequency identification (RFID) technology using detectors with a resolution of better than about 5 cm;
    processing said location and identification data to provide one or more parameters of movement including trajectories for said one or more model organisms;
    processing said data to identify a social relationship between at least two model organisms; and
    evaluating said social relationship to identify a behavioral phenotype in at least one of said model organisms.

2. A method according to claim 1 wherein processing said data includes automatically calculating locomotion information for at least two of said model organisms.

3. A method according to claim 1, comprising automatically quantifying said social relationship.

4. A method according to claim 1 wherein processing said data includes generating at least one behavioral parameter based on a plurality of other behavioral parameters.

5. A method according to claim 1, wherein processing said data includes calculating for one or more of said model organisms any one of, or any combination of, activity/resting time, circadian activity pattern, sleeping/resting time, mean velocity, daily travel distance, time chasing, and time being chased.

6. A method according to claim 1 wherein said automatic tracking includes use of video imaging having positional accuracy in the range of about 0.1 cm to about 3 cm.

7. A method according to claim 1 wherein said detectors have a spatial resolution of better than 5 cm.

8. A method according to claim 7, wherein said detection includes video imaging and said tracking comprises fusing a succession of video images and RFID information.

9. A method according to claim 1 comprising classifying said one or more model organisms based on said behavioral phenotype.

10. A method of identifying and classifying complex social behaviors among a group of model organisms, each having a permanently affixed or implanted RFID transponder, comprising:
    enclosing said group of model organisms in a monitored space divided into RFID monitored segments;
    RFID tracking a location, at a spatial resolution of 10 cm or better, of each model organism by reading the RFID transponder in each model organism over a period of time,
    wherein said reading is performed using a plurality of detectors distributed in and around said enclosure;
    capturing a sequence of images of one or more model organisms over said period of time; and
    calculating at least one spatiotemporal model of each model organism based on time synchronization of said RFID identifying information of said model organism with said sequence of images.

11. A method according to claim 10 wherein said spatiotemporal model includes calculating a best path for each model organism by extrapolating between imaged positions of each model organism in at least a portion of said sequence of images and predicted positions.

12. A method according to claim 10 wherein said RFID tracking includes reading at least one transponder as each model organism with a transponder moves across segments.

13. A method according to claim 10, wherein said calculating comprises fusing video data and RFID data.

14. A method according to claim 13, wherein said fusing comprises using RFID data to assist in clustering video data or using video data to improve a trajectory provided by RFID identification data.

15. A method according to claim 10, wherein capturing a sequence of images comprises generating a reference image based on a plurality of images acquired while said organisms are being imaged.

16. A system, comprising:
    an enclosure for accommodating a group of at least 3 model organisms, each model organism having at least one RFID transponder;
    a plurality of RFID readers distributed in said enclosure such that their RF coverage divides said enclosed space into RFID monitored segments,
    an imaging system, providing resolution of between about 0.1 and about 3 cm for capturing a sequence of images of said enclosed space;
    a processor configured to provide one or both of (a) at least one spatiotemporal model for one or more model organisms in said group (b) trajectories of one or more of said model organisms based on combined RFID data and said sequence of imaging data for said model organisms.

17. A system according to claim 16, wherein said processor is configured to provide both of said (a) and (b).

18. A system according to claim 16, wherein said processor is configured to automatically classify a phenotype or quantify a behavior of said animal.

19. A system according to claim 16, wherein said processor is configured to automatically extract social behavior for a plurality of said model organisms.

20. A system according to claim 16, wherein said processor is configured to collect information correlated with a treatment of said model organisms.

21. A system according to claim 16, configured to identify one or more trigger conditions and to store data, collect data and/or control an actuator in the system, in response thereto.

22. A system according to claim 16, wherein said enclosed space comprises a large environment of an area matching a natural habitat size for said group.

23. A system according to claim 16, configured to track a vertical component of position in at least part of said enclosure.

24. A method according to claim 1, wherein said tracking comprises fusing video tracking and RFID identification information.

25. A method according to claim 1, wherein said trajectory tracking is performed by a plurality of detection modalities using detectors distributed in and around said enclosure.

26. A method according to claim 1, further including comparing the trajectories of two of said model organisms.

27. A method according to claim 1, wherein said trajectories are substantially continuous.

28. A method according to claim 27, wherein providing said trajectories includes calculating a continuous best path for each model organism from a sequence of location data for said model organisms.

29. A method according to claim 6, wherein the video imaging has a time accuracy of between 0.01 and 1 second.

30. A method according to claim 10, wherein processing said data to identify a social relationship between at least two model organisms includes generating trajectories for said model organisms.

31. A method according to claim 30, wherein said trajectories are generated by calculating a continuous path from a sequence of said images of said model organisms.

32. A method according to claim 31, wherein said continuous path is a calculated best path for each model organism.

33. A method according to claim 10, wherein said reading includes using a plurality of detectors uniformly distributed at the bottom of said enclosure.

34. A method according to claim 10, further including distinguishing the identity of two model subjects of said group of model organisms within an RFID monitored segment, using said sequence of images.

35. A system according to claim 16, wherein said trajectories are generated from a fusion of RFID data and said sequence of imaging data for a plurality of said model organisms.

36. A system according to claim 16, wherein said trajectories are generated by calculating a continuous best path for each model organism by extrapolating between location data for each model organism in at least a portion of a sequence of said location data and predicted positions.

37. A system according to claim 16, wherein the time accuracy of the trajectories is between 0.01 and 1 second.

38. A system according to claim 16, wherein said processor is further configured to provide distinguishing information as to the identity of two model subjects of said group of model organisms within an RFID monitored segment.

39. A system according to claim 16, wherein said imaging system provides one or more of an optical, thermal, infrared, ultrasound, or video image.

40. A method according to claim 10, wherein said detectors are arrayed in a configuration which is independent of structures within said enclosure.

41. A method according to claim 10, wherein said group of model organisms includes a number of organisms selected from the range of from 10 to 100.

42. A method according to claim 10, wherein said spatiotemporal model provides accurate identification of at least two organisms that share a same position for a time above a threshold.

43. A method according to claim 42, wherein said spatiotemporal model further provides accurate identification of at least two organisms that share a same position for a time above a threshold and an amount of movement below a threshold.

44. method according to claim 10, wherein calculating provides data measured as a function of time when an organism is within a threshold distance of a threshold number of other organisms.

45. A method according to claim 10, wherein said calculating determines a position of at least one of front and rear sections of a body of one of said organisms.

46. A method according to claim 10, wherein said method is performed in real time.

47. A method according to claim 10, wherein said RFID tracking is performed with a position accuracy of from between 0.1 and 3 cm and a time accuracy of from between 0.01 and 1 seconds.

* * * * *